US006856197B1

(12) United States Patent
Humphrey

(10) Patent No.: US 6,856,197 B1
(45) Date of Patent: Feb. 15, 2005

(54) SYMMETRICAL CURRENT AMPLIFIER

(75) Inventor: Ted Humphrey, Clearwater, FL (US)

(73) Assignee: Electronic Topologies, Inc., Dunedin, FL (US)

( * ) Notice: Subject to any disclaimer, the term of this patent is extended or adjusted under 35 U.S.C. 154(b) by 0 days.

(21) Appl. No.: 10/627,669

(22) Filed: Jul. 28, 2003

(51) Int. Cl.$^7$ ................................................ H03F 3/45
(52) U.S. Cl. ...................................... 330/252; 330/258
(58) Field of Search .............................. 330/9, 69, 252, 330/258, 261; 327/359

(56) References Cited

U.S. PATENT DOCUMENTS

| | | | |
|---|---|---|---|
| 3,497,824 A | | 2/1970 | Goordman |
| 4,357,578 A | | 11/1982 | Yokoyama |
| 4,532,479 A | | 7/1985 | Blauschild |
| 4,555,673 A | | 11/1985 | Huijsing et al. |
| 4,794,348 A | * | 12/1988 | McGinn ...................... 330/252 |
| 5,396,194 A | | 3/1995 | Williamson et al. |
| 5,714,906 A | | 2/1998 | Motamed et al. |
| 5,859,566 A | * | 1/1999 | Voorman et al. ............. 330/252 |
| 6,316,995 B1 | * | 11/2001 | Chen et al. .................. 330/252 |
| 6,486,737 B1 | | 11/2002 | Carter |
| 6,518,842 B1 | | 2/2003 | Carter et al. |

OTHER PUBLICATIONS

SIGNETICS, NE/SA5230 Low Voltage Operational Amplifier, Jun. 11, 1987, 853–0942 89304, Signetics, Sunnyvale, CA.
Tom Delurio, et al., 2V op amp rides . . . , Electronic Design, Jul. 25, 1985, pp. 151 –155, Electronic Design.
SIGNETICS, SE/NE5212 Transimpedance Amplifier, May 2, 1986, Signetics Linear, Sunnyvale, CA.
Kester, High Speed Operational Amplifiers, High Speed Design Techniques, 1996, pp. 1–1 => 1–17, ISBN–0–916550–17–6, Analog Devices, Norwood, MA.

Kester, High Speed Op Amp Applications, High Speed Design Techniques, 1996, pp. 2–36 => 2–38, ISBN–0–916550–17–6, Analog Devices, Norwood, MA.
Analog Devices, OP279 Rail–toRail High Output Current Operational Amp, Oct. 1994, Analog Devices, Norwood, MA.
Kester, 1992 Amplifier Applications Guide, 1992, pp. 10–11, ISBN–0–916550–10–9, Analog Devices, Norwood, MA.
Analog Devices, AD811 High Performance Video Op Amp, p. 2, 11/91, Analog Devices, Norwood, MA.
Analog Devices, AD8001 800 Mhz, 50 mW Current Feedback Amplifer, p. 2, 8/95, Analog Devices, Norwood, MA.

(List continued on next page.)

*Primary Examiner*—Henry Choe

(57) ABSTRACT

This patent teaches the creation and use of current amplifiers. The use of current inputs allows one to use techniques normally associated with Current Feed Amplifiers. The patent uses a family of topologies that include two inputs that are responsive to currents. These two inputs are substantially equal in properties. This is an improvement over existing Current Feedback Amplifier designs where there is actually one voltage input and one current input which draws a lot of current as it is really the output of a buffer. This patent uses amplifier topologies that give us amplifiers with lower distortion, improved frequency response, increased DC stability, and increased stability of internal biasing than prior art. This is accomplished with a simplification of circuit complexity, reduced reliance upon $V_{be}$ matching of transistors, and takes away the need to use the long-tailed pair for amplification. The patent teaches embodiments that go beyond that of Current Feedback Amplifiers as currently implemented. This patent teaches how to amplify a signal (or the difference of two signals) by the use of dual amplified (buffered) current subtractions at a high impedance point. Some of the topologies can be used at very low supply voltages without the usual loss of performance.

24 Claims, 21 Drawing Sheets

OTHER PUBLICATIONS

Analog Devices, AD8011 300 Mhz, 1 mA Current Feedback Amplifier, p. 2 & 9, 2/95, Analog Devices, Norwood, MA.

Analog Devices, BUF04 Closed–Loop High Speed Buffer, p. 9, 10/93, Analog Devices, Norwood, MA.

INTERSIL, HA–2539 600 MHz, Very High Slew Rate Op Amp, May 2003, FN2896.5, Intersil, Palm Bay, FL.

INTERSIL, HA–2540 400 MHz, Fast Settling Op Amp, Jul. 2003, FN2897.5, Intersil, Palm Bay, FL.

HARRIS/INTERSIL, HFA–0005 High Slew Rate Op Amp, Mar. 1993/Sep. 1998, FN2918.1 & FN2918.2, Intersil, Palm Bay, FL.

HARRIS/INTERSIL, HA–5004 100 MHz Current Feedback Amplifier, Mar. 1993, FN2823.1, Harris, Melbourne, FL.

HARRIS/INTERSIL, HFA1130 Ultra High–Speed CFA, Mar. 1993/Jul. 2002, FN3369 & FN3369.3, Intersil, Palm Bay, FL.

INTERSIL, HA–5190/5195 150 MHz,, Fast Settling Op Amp, Aug. 2002, FN2914.4, Intersil, Palm Bay, FL.

INTERSIL, HA–5102/5104 Dual & Quad 8 Mhz & 60 Mhz Low Noise Op Amp, Jun. 2003, FN2925.8, Intersil, Palm Bay, FL.

HARRIS/INTERSIL, HA–5020 100 MHz Current Feedback Amplifier, 1992, FN845.2, Harris, Melbourne, FL.

élantec, EL2038C 1GHz Op Amp, Nov. 1993, élantec Semiconductor, Milpitas, CA Obsolete—out of print.

élantec, EL2041C Wideband, Fast Settling, Unity Gain Stable, Op Amp, Nov. 1993, élantec Semiconductor, Milpitas, CA.

élantec, 1997 Data Book, 1997, élantec Semiconductor, Milpitas, CA AN #3, DC Restored 100 Mhz Current Feedback Video Amp, pp. 8–7 => 8–17.

AN #23, Practical CFAmp Design Considerations, pp. 8–122 => 8–132, By Barry Harvey.

EL202C, 50 Mhz CFA, pp. 2–58 => 2–71.

EL2030C, 120 Mhz CFA, pp. 2–75 => 2–88.

EL2070C, 200 Mhz CFA, pp. 2–137 => 2–150.

EL400C, 200 Mhz CFA, pp. 2–151 => 2–161.

EL2070C, 150 Mhz CFA, pp. 2–163 => 2–176.

EL2099C, Video Distribution Amplifier, pp. 2–219 => 2–232.

EL2120C, 100Mhz CFA, pp. 2–233 => 2–244.

EL2130C, 85 Mhz CFA, pp. 2–245 => 2–252.

EL2160C, 130 Mhz CFA, pp. 2–309 => 2–324.

EL2166C, 110 Mhz CFA, pp. 2–368 => 2–384.

EL2170C, 70 Mhz/1mA Current Mode Feedback Amp, pp. 2–385 => 2–400.

EL2180C, 250 Mhz/3mA Current Mode Feedback Amp, pp. 2–431 => 2–446.

Rea Schmid, OA–25 Stability Analysis of CFAs, May 1995, AN012787, National Semiconductor (originally Comlinear), Santa Clara, CA.

Rea Schmid, OA–18 Simulation SPICE Models for Comlinear Op Amps, Jul. 1995, National Semiconductor, Santa Clara, CA.

National Semi, CL109 Low–Power, Wideband, Closed–Loop Buffer, Jun. 1994, National Semiconductor, Santa Clara, CA.

National Semi, CLC111 Ultra–High Slew Rate, Closed–Loop Buffer. Jun. 1999, National Semiconductor, Santa Clara, CA.

National Semi, LH4118 Low Gain Wide Band RF Amplifier, Oct. 1988, National Semiconductor, Santa Clara, CA.

Timothy T. Regan, AN–278 Designing with a New Super Fast Dual Norton Amplifier, Sep. 1981, National Semiconductor, Santa Clara, CA.

National, AN–72 The LM3900: A New Current–Differencing . . . Amplifiers, Sep. 1972, pp. 1–10, National Semiconductor, Santa Clara, CA.

NATIONAL. Complinear High–Speed Analog and Mixed–Signal Databook, Items & pages #'s to follow, 1997, National Semiconductor, Santa Clara, CA.

LM6171 High Speed . . . Voltage Feedback Amplifier, pp. 4–243 => 4–268.

LM6181 100 mA, 100Mhz Current Feedback Amplifier, pp. 4–269 => 4–285.

LM7171 Very High Speed . . . Voltage Feedback Amp, pp. 4–344 => 4–357.

CLC400 Fast Settling . . . Op Amp, pp. 4–20 4–23.

CLC401 Fast Settling . . . Op Amp, pp. 4–2 4–27.

CLC410 Fast Settling . . . Op Amp, pp. 4–60 4–65 Other datasheets corresponding to SPICE Models from OA–18 above item # FB: as listed on p. 2 of reference FB (OA–18) above.

National Semi, LM6142 . . . Op Amps, National Op Amp Databook, 1995, pp. 1–504 1–514, RRD/RRD150M95, National Semi, Santa Clara, CA.

Linear Technology, LT1206 250mA/60Mhz CFA, Jun. 24, 1993, LT/GP 0993 10K Rev 0, Linear Technology, Milpitas, CA.

Linear Technology, LT1217 Low Power 10Mhz CFA, BA/GP 0192 10K Rev 0, Linear Technology, Milpitas, CA.

Linear Technology, LT1223 100Mhz CFA, BA/GP 0791 10K Rev 0, Linear Technology, Milpitas, CA.

Linear Technology, LT1227 140Mhz Video CFA, LT/GP 0892 10K Rev 0, Linear Technology, Milpitas, CA.

Linear Technology, LT1228 100Mhz CFA w/DC Gain Control, BA/GP 0192 10K Rev 0, Linear Technology, Milpitas, CA.

Linear Technology, LT1230 Dual & Quad 100Mhz CFA, BA/GP 0192 10K Rev 0, Linear Technology, Milpitas, CA.

Linear Technology, LT1252 Low Cost Video Amplifier, Oct. 1992 LT/GP 0293 10K Rev 0, Linear Technology, Milpitas, CA.

Linear Technology, LT1351 250uA, 3Mhz, 200 . . . Op Amp, Linear Technology, Milpitas, CA.

Linear Technology, LT1360 50 Mhz, 800V/us Op Amp, 1994 LT/GP 0494 10K, Linear Technology, Milpitas, CA.

Linear Technology, LT1813 Dual 3mA . . . Op Amp, 1999 1813f LT/TP 0999 40K, Linear Technology, Milpitas, CA.

Andreas Hahn, Application of Rail–to–Rail Op Amps, Dec. 1999, SLOA039A, Texas Instruments, Dalls, TX.

James Karki, Voltage Feedback vs Current Feedback Op Amps, Nov. 1998, SLVA051, Texas Instruments, Dallas, TX.

TI, THS3001 140–Mhz High–Speed CFA, Jul. 1998, SLOS217, Texas Instruments, Dallas, TX.

TI, THS4150/4151 High–Speed Differential I/O Amps, May 2000Rev Jan. 2004, SLOS3210, Texas Instruments, Dallas, TX.

Burr Brown (TI), OPA603 High Speed, Current–Feedback Op Amp, May 1991, PDS1026B, Burr Brown (now Texas Instruments), Tucson, AZ.

Burr Brown (TI), OPA622 Wide–Bandwidth Op Amp, Oct. 1992, PDS–1131A, Burr Brown (now Texas Instruments), Tucson, AZ.

Burr Brown (TI), OPA623 Wide Bandwidth, Current–Feedback Op Amp, Dec. 1992, PDS–1132A, Burr Brown (now Texas Instruments), Tucson, AZ.

Klaus Lehmann, AB–180 Ultra High–Speed ICs, Burr–Brown IC Application Handbook, 1994, pp. 244–248, LI–459, Burr Brown (now TI), Tucson, AZ.

Burr Brown (TI), OPA660 Wide Bandwidth, Operational Transconductance Amp & Buffer, Sep. 1991, PDS–1072B, Burr Brown (now TI), Tucson, AZ.

* cited by examiner

Non-Functional

SYMMETRICAL CURRENT AMPLIFIER

CROSS-REFERENCE TO RELATED APPLICATIONS

There is co-pending patent application to this one. The Title is Analog Electronic Device and the Applicant is Ted Humphrey. It also is being filed in July 2003. It claims, in one of its dependant claims, the use of the teaching of that proposed device to create an amplifier where the amplifier could under certain conditions be viewed as a current amplifier, which is the subject of this patent application. The current amplifiers as detailed in the co-pending patent application depend on the teaching of that patent for their existence. Therefore the amplifiers taught in that patent could not be included in this patent. Those teachings show new unique ways to design an amplifier using a basic device, the core of that patent, that are an improvement over what could be designed before that invention. There is no common structure taught in the two patents.

1. Technical Field

This invention relates to the creation and use of electronic current amplifiers. The invention teaches a topology, really a family of topologies, that can be used to create amplifiers with 2 inputs that are responsive to input current. It further teaches how to extend this topology and the use of current amplifiers to get improved performance and simplicity.

2. Prior Art

After the advent of transistors, the transition to differential amplifier circuits was swift. Traditionally, most amplifiers have been based on a "long tailed pair". The advantages affected most spheres of use.

Examples are to be found in early reference works such as the *Transistor Manual* from General Electric of 1964. Starting on page 111 is a complete analysis of the differential amplifier circuit.

Early U.S. Pat. No. 3,541,465 titled *Transistor Differential Amplifier Circuit* by Nagata (1970) show advancements to the basic circuit; in this case cascoding the input transistors. Whereas U.S. Pat. No. RE30,587 by RCA (1981) was an improvement in the buffering of the output, where with feedback, the output voltage can be forced to some useful level. The circuit depends highly upon matching of transistor $V_{be}$ voltages for it DC stability and operation.

The basic endeavor of an amplifier (circuit) is to "examine" the input(s) and produce an output that is a multiple of the difference of the inputs. The input difference is usually a voltage and the output is a voltage It is usually desired that the output is referenced to some useful reference point, generally ground. This aids in applying negative feedback to the circuit. If the DC deviations between the input and the output of the amplifier are too great then biasing and feedback become too complicated. Other DC concerns are offset, bias current, and drift. There can be AC deviations also AC concerns include: frequency response, clipping, and distortion products such as harmonic distortion, inharmonic distortion, power supply induced distortion and slew rate limiting (internal saturating of transistors).

The use of the long-tailed pair works by converting a voltage difference to a current difference. Most early non-differential circuits converted a voltage input to a current across a resistor thus producing a voltage. In FIG. 1, voltages $V_{in1}$ and $V_{in2}$ produce currents that flow through $R_{L1}$ and $R_{L2}$ producing voltages $V_{out1}$ and $V_{out2}$. The bipolar transistor is ill suited to converting a voltage to a current much less a voltage to a voltage, which it can not do directly. Much of the research in design of transistor circuits has been in the direction of handling the problems associated with this converting of a voltage difference to a voltage. Some DACs use currents to develop speed and accuracy and some digital circuits use current steering for speed. Otherwise, in a voltage domain, handling items such as Miller Effect, hard saturation, Early effect, biasing instabilities, level shifters, phase inverters, buffering, etc. becomes the problem.

One might try to consider the use of a transistor in a common-emitter configuration as a current amplifier BUT I am not aware of any prior art showing such a usage. The reasons are obvious. The problems are too many and too great to ever create a useful circuit. The problems include offset—the output voltage not being close enough to the input voltage to allow negative feedback, biasing stability, common mode limits, no good way to use feedback to control the gain without affecting biasing, etc.

With time, we see the advent of Current Feedback Amplifiers (CFAs). This advancement helps the art of electronics as it forces the amplifier to work more in the current domain. U.S. Pat. Nos. 4,502,020 and 4,713,628 by David A. Nelson of Comlinear (1985 & 1987) are basic. Improvements are included in U.S. Pat. No. 5,786,731 by National Semiconductor. We have also the Diamond Circuit of Burr Brown. The cleanest example (schematic) is the simplified circuit of the LM6181 by National (or elantec EL2020 or Burr Brown OPA603) and reproduced as FIG. 2. This circuit is typical as Current Feedback Amplifiers are usually built around the same circuit for the input and output. That circuit is called by various names including a LH0002 (or just "0002") circuit or more recently a "4-transistor emitter follower" in U.S. Pat. No. 6,166,603 by Douglas L. Smith in his FIG. 1 and in the text of his patent. Transistors $Q_{301}$, $Q_{302}$, $Q_{303}$, and $Q_{304}$ form the input buffer and $Q_{312}$, $Q_{313}$, $Q_{315}$, and $Q_{316}$ form the output buffer in FIG. 2.

These CFA circuits generally have the following faults/weaknesses:
a) depend on emitter followers (for both input and output)
b) don't really have an inverting input but cheat and use an "output" as a low impedance input
c) with a low impedance "loading" the inv_input, as is intended under normal operation, the input stage of the circuit become a unity gain voltage buffer that has inherent non-linearity's (distortion) due to shifting DC levels, Miller Effect, Early Effect, etc. It is acknowledged in the industry that CFAs are not low distortion!
d) depend on the match of $V_{be}$ voltages for the biasing of the circuit
e) buffer the output with complicated emitter circuits which still depend on matching transistor $V_{be}$ voltages. See U.S. Pat. No. 5,786,731 by National Semi. (1998). See also National LM6181.

National has attempted to handle the problem of the low-impedance input by buffering that input with another input stage in their LM6171 This is an obvious solution that had been around and is best expressed by Burr Brown in some of their materials. In Burr Brown Application Bulletin AB-183, they detail what they call the DIAMOND CIRCUIT that is used in the OPA660 and OPA622. Nevertheless, the circuit still does not handle the basic weaknesses of the topology/structure/architecture.

There are a family of patents that pertain to input stages that have some structure similarity.

U.S. Pat. Nos. 4,357,578, 6,486,737 and 4,918,398 are not current amplifiers. U.S. Pat. No. 4,357,578 by Yokoyama Nov. 2, 1982 includes a system of resistors connecting the emitters of the input transistors. The drawings all includes either notations of voltage inputs or include resistors to ground at the inputs. Internally any signals are converted to voltages. The Yokoyama circuit is not as simple as proposed in this application and there is no teaching of anything close to that of a current amplifier. U.S. Pat. No. 6,486,737 has gm normalizing circuits that preclude the use of current inputs. U.S. Pat. No. 4,918,398 uses level shifters and input resistors for biasing in an interaction that also would preclude the use of current inputs.

The following are neither symmetrical not current amplifiers: U.S. Pat. Nos. 4,555,673, 4,532,479, 5,714,906, 4,977, 378, 5,294,892, 5,294,893, 5,153,529, 5,140,280, and 6,518, 842.

Two of these owned by Signetics Corporation are representative. U.S. Pat. No. 4,532,479 Blauschild Jul. 30, 1985 and U.S. Pat. No. 4,555,673 Huijsing et al Nov. 26, 1985. In the Blauschild patent, all drawings show a non-symmetrical amplifier. The patent repeatedly refers to "output signal at terminal 2 follows the voltage difference between terminals 1 and 2" or "amplifying a voltage difference between terminal 1 and 2". The "description of the preferred embodiment" explains in detail how changes in voltage input create changes in the output. Even computes voltage amplification at 50 to 300 and 30 to 120. Explains how "some or all of the bipolar transistors may be replaced with FETs." It is clear that the use of the patent is for voltage amplification. There is nothing in the patent that teaches anything about current amplifiers. The claims don't claim anything and the teaching in the rest of the patent don't teach anything that would lead someone to build a symmetrical current amplifier. In U.S. Pat. No. 4,555,673, the area of concern is common mode range and constant gm over input voltage range. The inputs of all the amplifier drawings show the inputs as voltages. Included is additional circuitry to change the function of the amplifier depending on the input common mode voltage. The embodiments in that patent won't work with current inputs. Document 98-2000-450 BA/RP2.5MFP0785 from Signetics in 1985 adds details of the implementation of the patent in describing the SA/SE/NE5230. It reinforces that the design is non-symmetrical and is intended to respond to voltage inputs. In fact it defeats ½ of the input structure at a time, making it impossible to function as a current amplifier. The structure of the circuitry in the patent is very different from that proposed in this patent application. That patent teaches a voltage input amplifier with improved handling of common mode input voltage and gm over voltage. This application teaches "symmetrical current amplifiers" with simpler topologies. So the structure, function and results are different.

This whole family of patents are directed toward handling gm normalization and extending common mode range. Both of these concerns deal ONLY with an amplifier when used in a non-inverting configuration. That is what these patents are about. In fact, when used in an inverting configuration, they generally revert back to a long-tailed pair differential voltage input amplifier.

In U.S. Pat. No. 5,396,194 Williamson, Audio frequency power amplifiers, there is shown in FIG. 24C, a subsection showing some structure that is similar to that proposed in this patent. In that drawing, even though it appears similar, it is a voltage amplifier. It compares a voltage input to the output voltage and produces voltages both internally and externally. This is evident by the fact that the output is connected to an inverting input directly without a resistor. Thus, even though there appears to be some possible structural similarity, the actual structure, the function, purpose and results are different. There is no way that the subsection as detailed in the drawing could be used or converted to a current amplifier. It does not show to anyone viewing it the need for, or how to construct a true current amplifier. There is nothing in the drawing or patent that teaches what this patent does.

SUMMARY OF INVENTION

The object of this patent is to increase the art of electronics. This patent thus teaches the creation and use of current amplifiers. These are amplifiers that respond to current inputs rather than voltages, as is dominant in the field. It suggests the use of a family of topologies that function as needed in that the inputs do respond to currents. These topologies also have the low offsets that are needed to be able to use negative feedback. I have included equations that detail how to use the circuits that are built around these topologies. This is an advancement because with the ability to use amplifiers that respond to current feedback in a useful manner, we can design simpler circuits while getting higher performance. The key over prior current feedback amplifiers is that the prior amplifiers actually only have one current input and that input is really the output of a buffer and therefore is very current hungry. That forces the amplifiers to be operated as non-inverting amplifiers in the main to get frequency response and reduce offset. That is not the case with this patent as the amplifiers that result have two current inputs that are well behaved. Thus they can be operated in the inverting configuration. A preferred mode as it leads to lower distortion. The embodiments detailed center around the use of dual amplified (buffered) current subtractions at a high impedance point.

Symbols and Equations

The capital letter Q with a subscript represents transistors. Transistors with the same subscript perform a similar function in the different drawings (amplifiers). The circuits build from simple to more complex.

A capital letter I with a subscript indicates a constant current source in the drawings. If the subscripts are the same, then the value of currents are the same. This value of current can be altered to change the performance of the circuit. It can be optimized for the desired usage of the amplifier and the properties desired. Discussion of this is included in the DISCLOSURE OF INVENTION.

The capital letters A, B, C, D, E, F, G and V are used to indicate connection to the world outside of the amplifier itself The letters A and B represent the inputs. C and D are outputs and are labeled such that a negative current "into" A or B will create a positive current from C or D respectfully and are therefore inverting inputs. E and F are internal summing points of the amplifier and with this connection the current gain can be controlled from outside the amplifier to configure the amplifier in some manner. G is also an output and is related by phase as detailed in the body of text. V with a subscript and a polarity indicate a connection to a supply voltage of some useful value. $I_{in}$, $V_{in}$, $I_{out}$, and $V_{out}$ are exactly what is expected, they label the input current/voltage and the output current/voltage.

Use of capital letters R and Z are used to represent an impedance, either simple or complex. The use of R is a special case of Z as it represents a simple resistance. Generally the two are used interchangeably in this patent. Generally, any time a resistor is shown exterior to the amplifier, it could be a complex impedance rather than a simple resistance. For clarity, this document will try to state when it is important or when observations can be make about the nature of that impedance as it relates to the functioning of the amplifier.

In the same manner, the use of the word "source" is intended to include "sink" depending on the polarity of the transistors involved. Also, the words "accepts" and "produces" do not imply a direction of flow (current) or a polarity of voltage.

$\beta$ always indicates the beta of a bipolar transistor and does not relate to feedback factors. It is generally in the range of 20 to 200. I generally estimate it at 100 for convenience.

Any equations included in this document are derived intuitively and are to show general properties of the circuit. They are first order approximations and are not meant to be necessarily a complete representation of the circuit. They are nevertheless offered as useful in understanding the workings of the circuit. There is much that is new here and so much work is yet to be done on an "academic" level fully detailing the properties of the circuits. This I leave to others as the included equations are sufficient to build workable/useful amplifiers.

DISCLOSURE OF INVENTION

While examining the subject of amplifying circuits and the weaknesses of different architectures, I made two advancements. This patent is the subject of one of those.

Using as a stable datum that bipolar transistors work best in a current mode, I worked out a new approach to amplifying.

Figure 1:
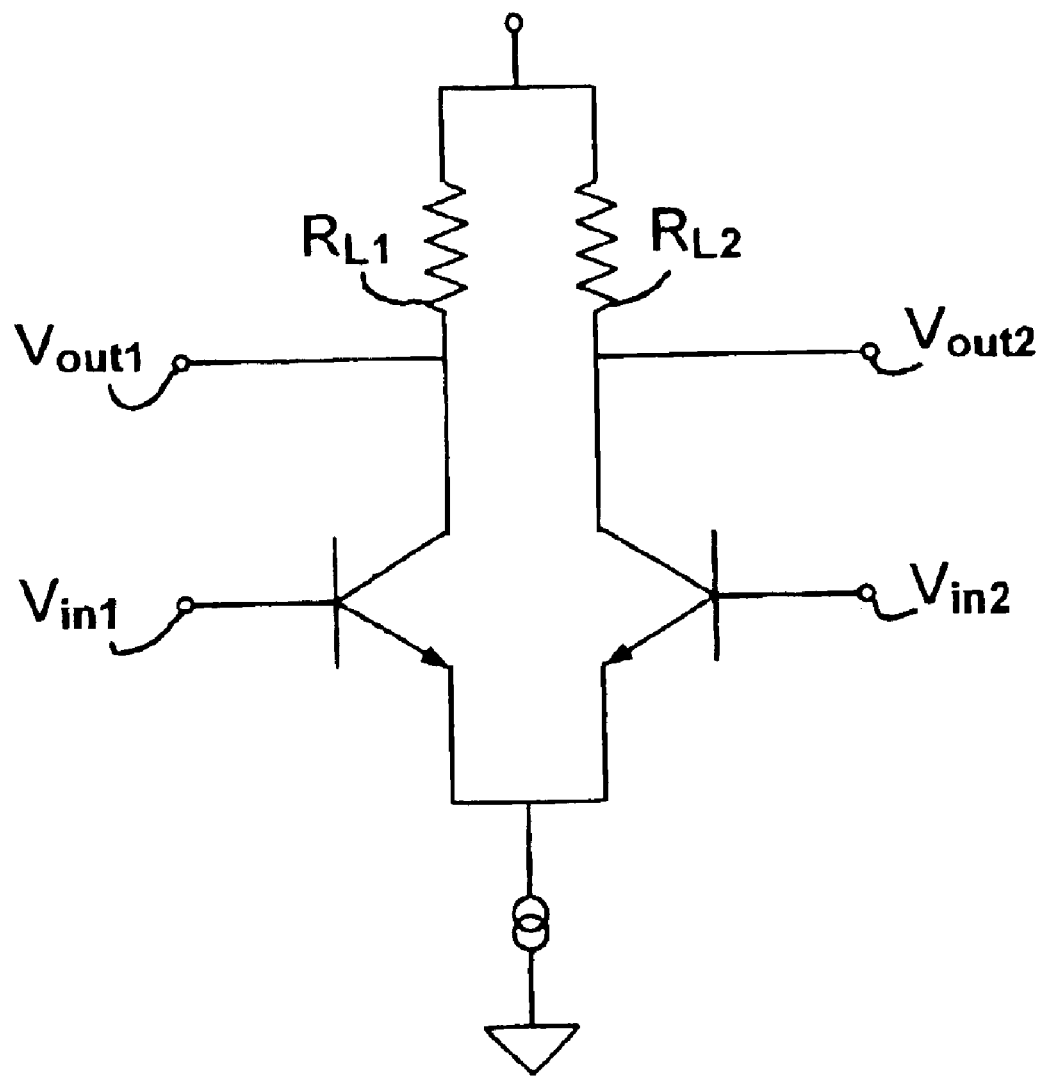
FIG. 1 shows prior art for a voltage differential amplifier.
Figure 2:
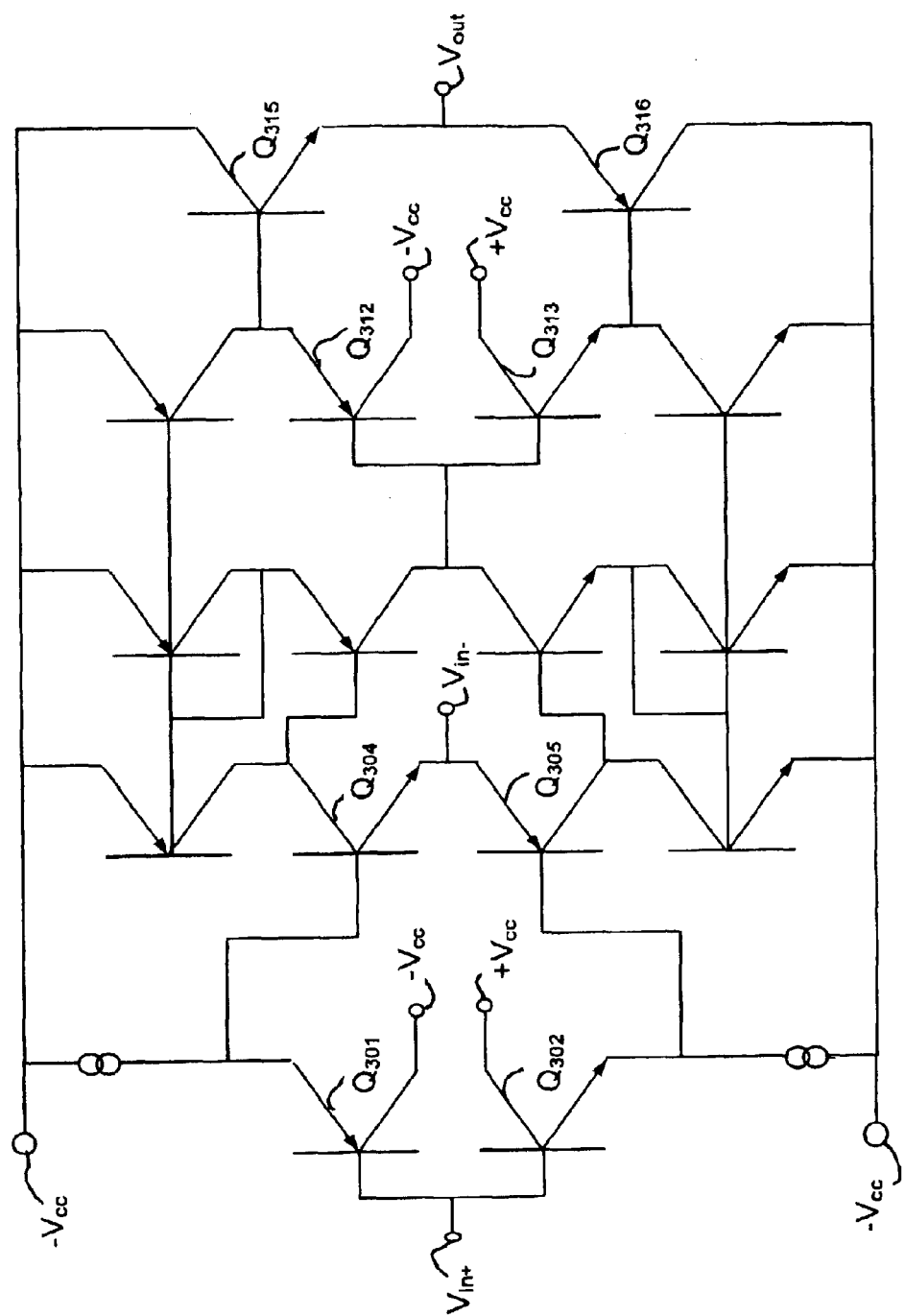
FIG. 2 shows prior art example of a Current Feedback Amplifier. This schematic is representative of many commercial integrated circuit amplifiers including National LM6181, élantec EL2030C, Burr Brown OPA623, Texas Instruments THS3001 and Comlinear CLC401.
Figure 3:
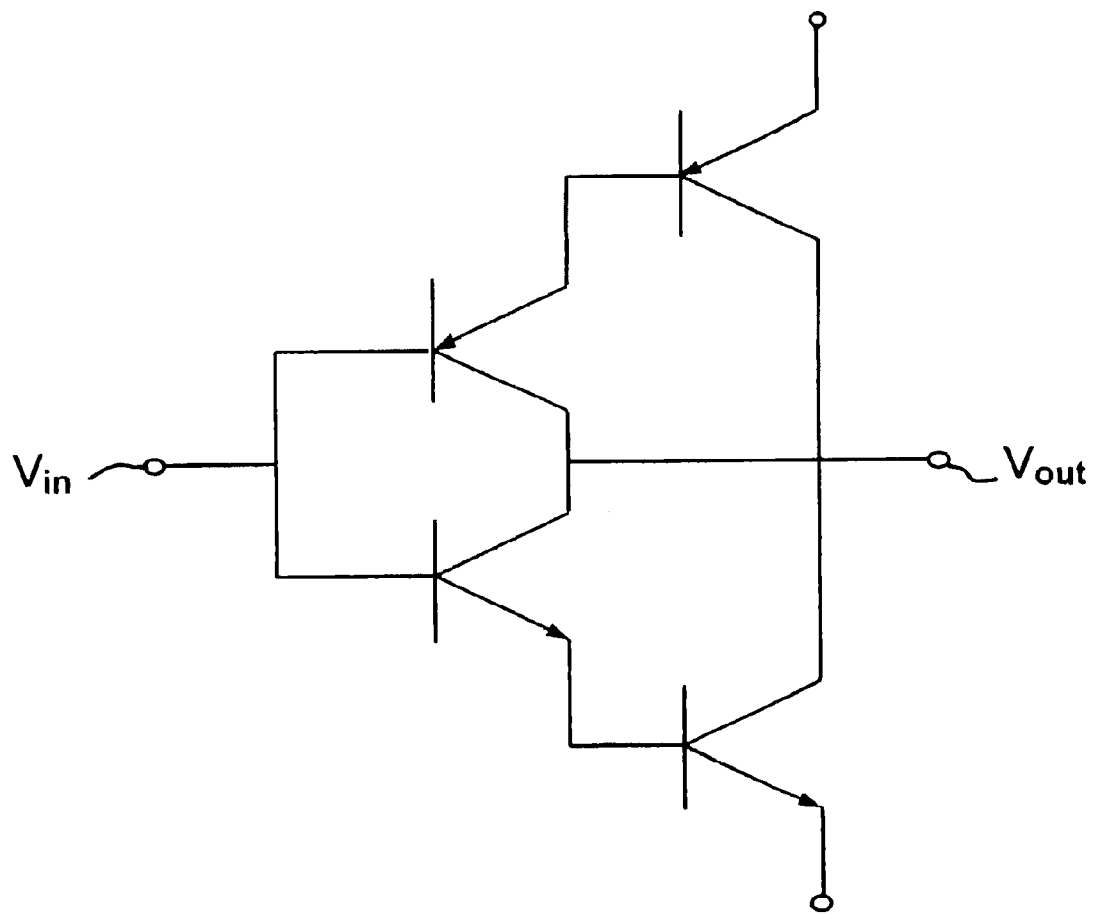
FIG. 3 is a dream circuit that is non-functional. Used as a point of departure.

I kept coming back to the circuit of FIG. 3. I just couldn't figure out how to get it to work. Finally I came up with the solution as detailed in this patent.

I knew I had to work with current. I knew that I had to handle items such as Miller Effect, hard saturation, Early effect, biasing instabilities, problems with level shifters and phase inverters, buffers, and the points mentioned about as a–e.

Figure 4A:
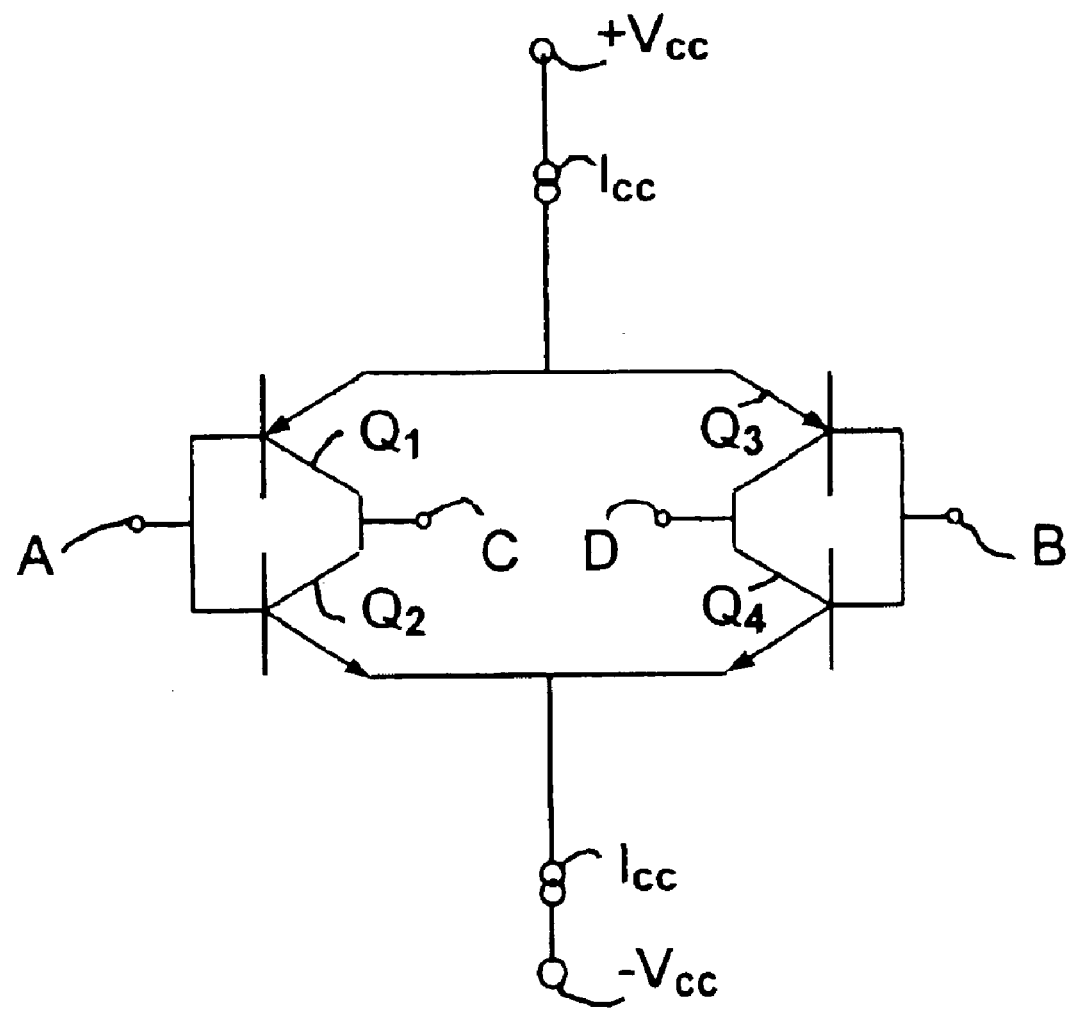
FIG. 4a shows the most simple embodiment of the teachings of this patent. It is a fully functional differential current amplifier. It relates to claims 1, 2, 4, and 6.
Figure 4B:
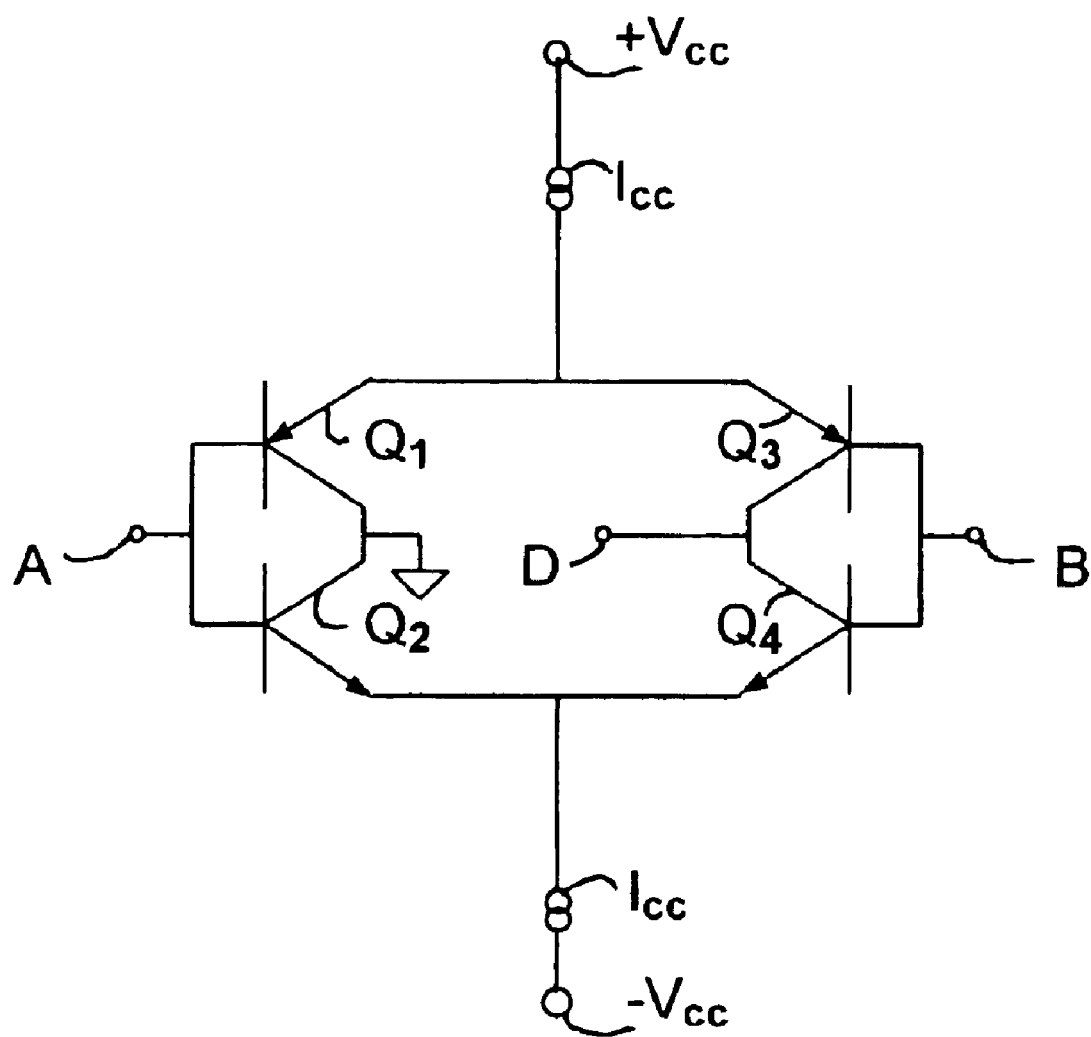
FIG. 4b shows a usage of 4a with one output connected to ground. It relates to claims 1, 3, 5, and 14.

FIGS. 4a and 4b are first steps. The circuit in FIG. 4a is composed of transistors $Q_1$, $Q_2$, $Q_3$, and $Q_4$ along with two current sources $I_{cc}$. It accepts two current inputs and outputs a current between C and D equal to $\beta^*(I_B-I_A)$ (or from C to Ground and from Ground to D). This circuit has some limitations concerning common mode range—both current and voltage. BUT it does do a lot and gives a great place to start. It is a filly workable circuit. It just works best under certain conditions.

Figure 16:
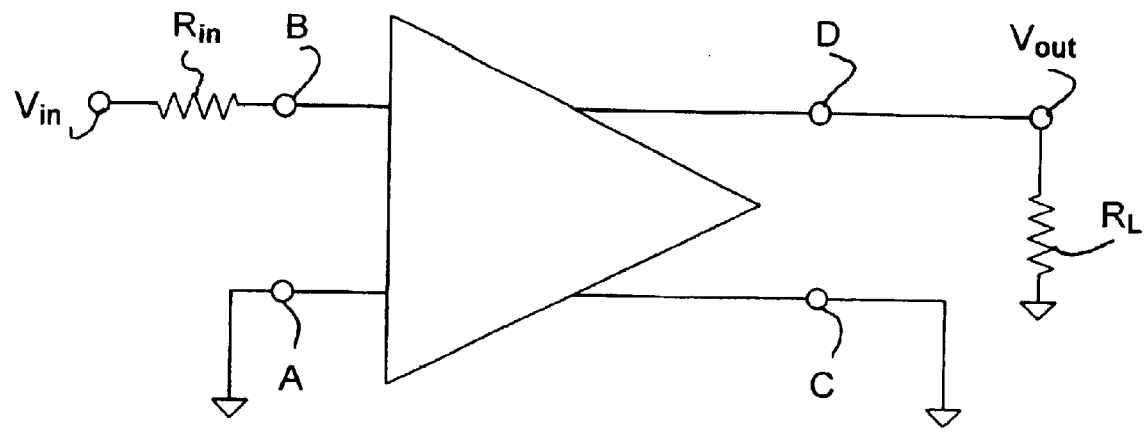
FIGS. 16 and 17 are used to determine the single ended open loop gain and closed loop gain of the amplifier.
Figure 17:
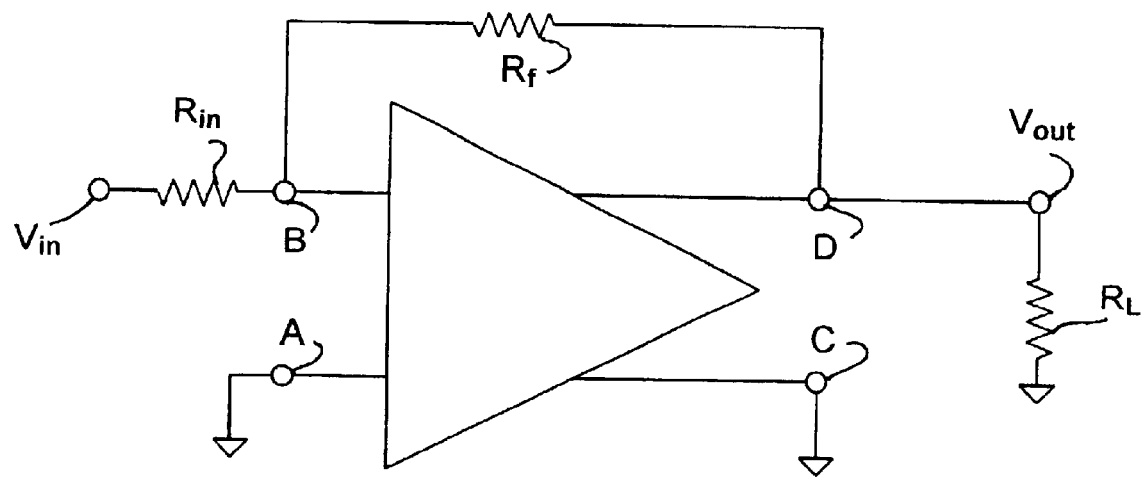

FIG. 4b is similar but has only one output. Any current that would have flowed from C in FIG. 4a is shunted to ground. The current out from D is still equal to $\beta^*(I_A-I_B)$. Connecting resistors to the amplifier, either FIG. 4 or 4b, as shown in FIG. 16, we can work out equations for the amplifier. With A grounded (generally through a resistor), then $I_D=-\beta^*I_B$. Looking to FIG. 16, with an input resistor $R_{in}$, A connected to ground and output resistor $R_L$ (to ground), then $V_{out}=I_{out}*R_L=-\beta^*I_{in}*R_L=-\beta^*V_{in}/R_{in}*R_L$, then $A_{ol}=V_{out}/V_{in}=-\beta^*R_L/R_{in}$. We now have the open loop voltage gain of the circuit. This is a similar equation to that associated with CFAs. Using feedback resistor of $R_f$ as shown in FIG. 17, and calculating the Loop Gain, we get Loop Gain=$(-\beta^*R_L/R_{in})/(-R_f/R_{in})=\beta^*R_L/R_f$. Again a similar equation to that of a CFA where the loop gain is a function of the feedback resistor but independent of the closed loop gain of the circuit. In usual terms of CFAs, the transresistance is simply $\beta^*R_L$.

Figure 5:
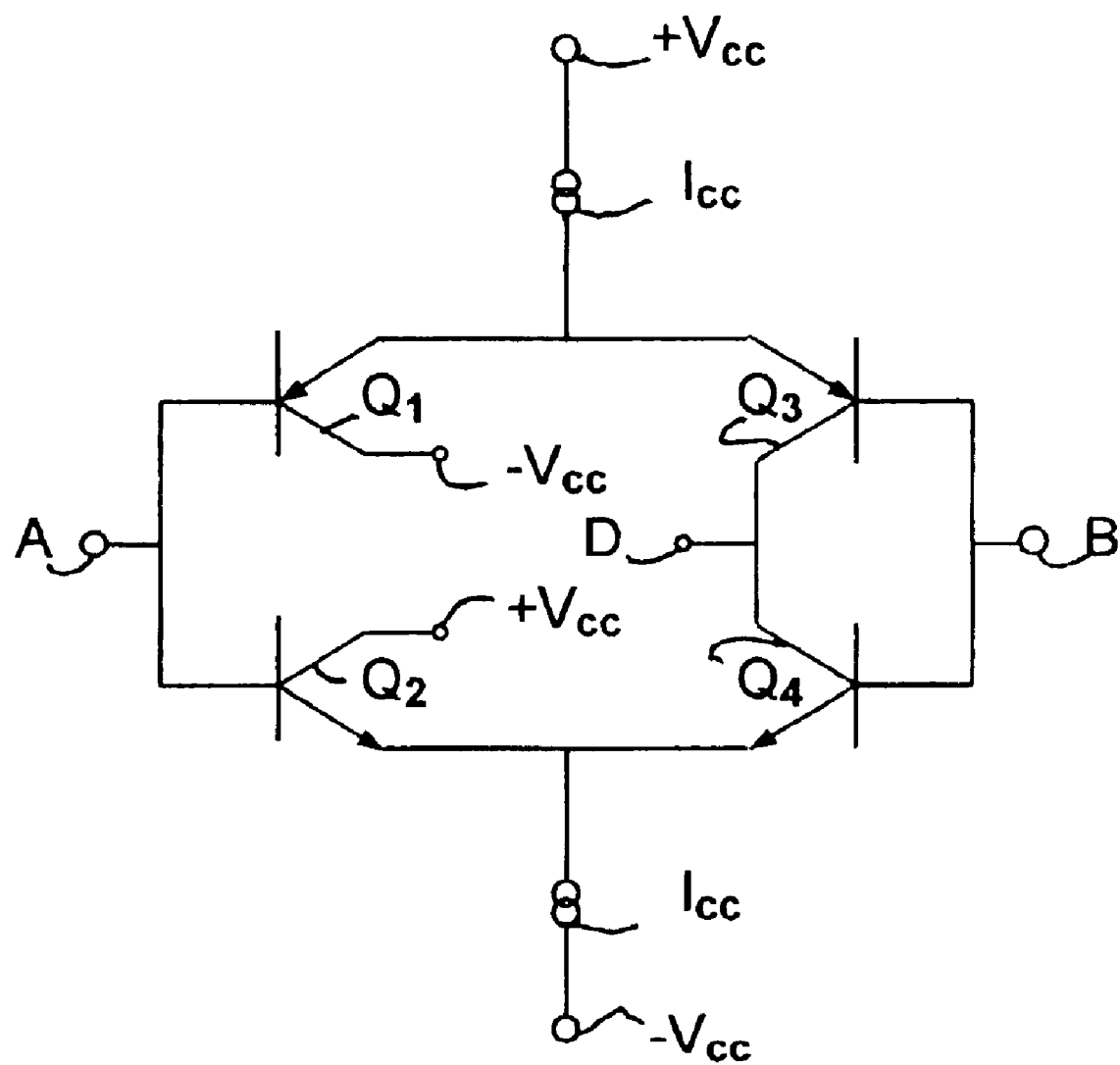
FIG. 5 shows the amplifier of FIG. 4a with one of the outputs disabled so that there are two inputs and only one output. The amplifier is a differential current amplifier where the difference of input currents produces a current output. The figure relates to claims 3, 5, and 16.

FIG. 5 handles some of the common mode problems. In particular if one locks (connects) A to ground, then $I_D=-\beta^*I_B$ with some limits to common mode voltage range. Alternatively, one can lock (connect) B to ground and $I_C=+\beta^*I_A$ again with some common mode voltage limits.

Figure 6:
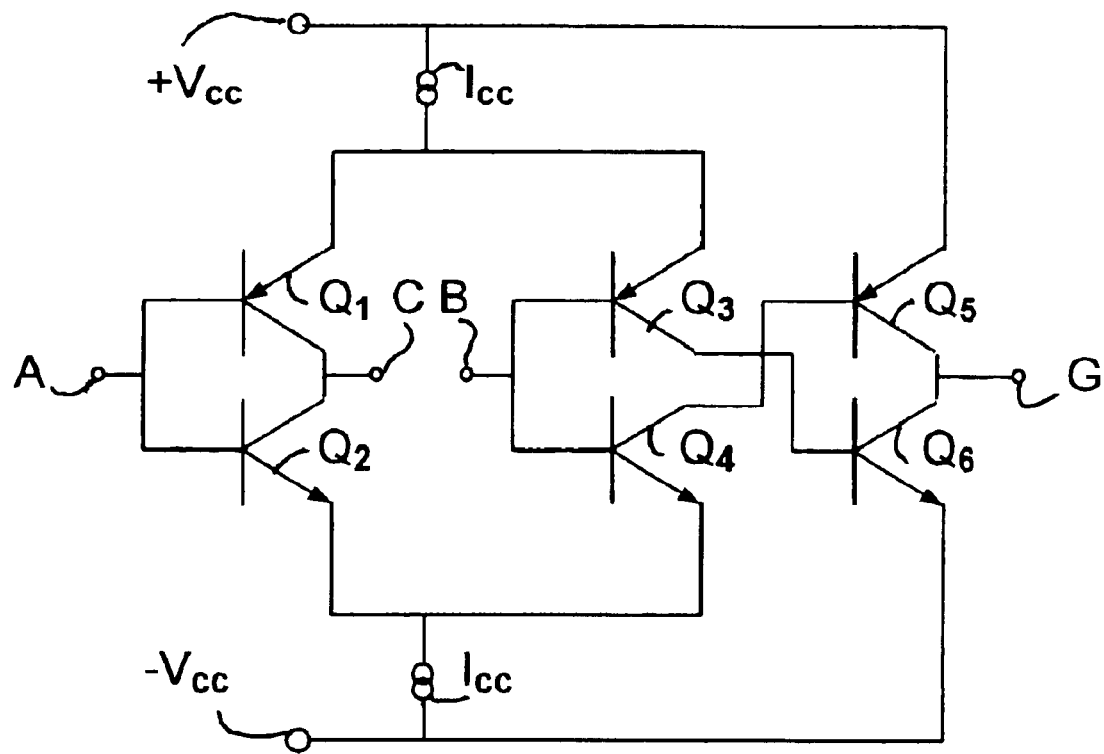
FIG. 6 shows a modification of the circuit, where with the addition of another stage following one half of the amplifier, that produces a circuit where both the outputs are in phase. This circuit is useful when hooked up properly. See also FIG. 13. This figure relates to claims 11 and 12.

FIG. 6 is an interesting circuit. Its main usage is displayed in FIG. 13. The circuit is derived from FIG. 4A with the addition of transistors $Q_5$ and $Q_6$. Input A is an inverting input for both C and G. Input B is a non-inverting input for both C and G. Feedback can only be from one of the outputs to input A. The output at the other output would be affected by the input signal and by the loading on the other output with feedback attached and would be a current output independent of the load impedance at the "unregulated" output. Any voltage could end up much larger or smaller very easily. The outputs differ by a factor of beta even before this adjustment. Even if both loads were the same, one would get more current than the other load by a factor of beta. One could also ground one of the outputs. A resistor at output C would have affects on the input common mode range as any voltage imposed there would "appear" at input A.

Figure 7:
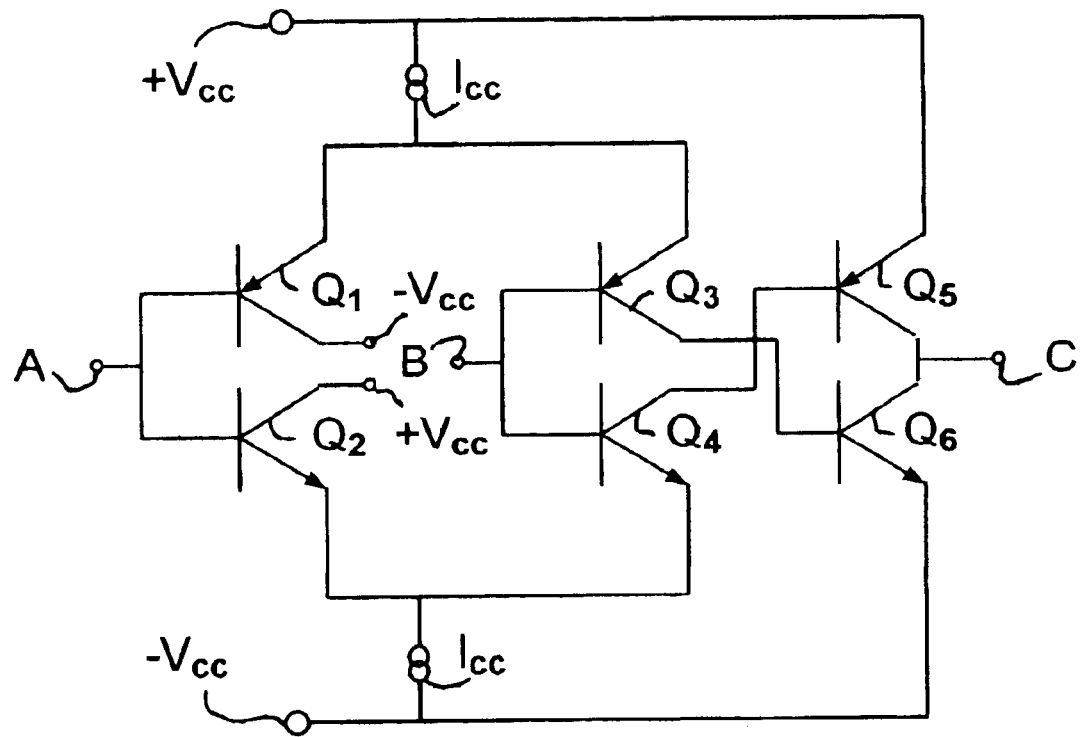
FIG. 7 shows a modification of FIG. 4 or 6 with only one output but still two differential inputs. This figure relates to claims 3, 5, 14, and 17.

FIG. 7 is an improvement with regard to common mode limitations with just only one output. The voltage imposed on the inputs by any voltage generated at an output can be figured. Looking at FIG. 16–22, we see that such a voltage is the same as the reference point for the load. In other words, if the amplifier has a load that is attached to ground and a feedback resistor, then the input point A will be at ground because practically zero offset current needs to flow through the feedback resistor. Or if B is attached to ground, then the input A will be forced the ground by the subtraction and addition of $V_{be}$ voltages of the input transistors $Q_1$, $Q_2$, $Q_3$, and $Q_4$. In FIG. 7 the circuit will function as long as this reference voltage is kept at least a certain distance from the rail voltages. Same equations as above hold true for this circuit with a transresistance of $\beta^2*R_L$.

Figure 8:
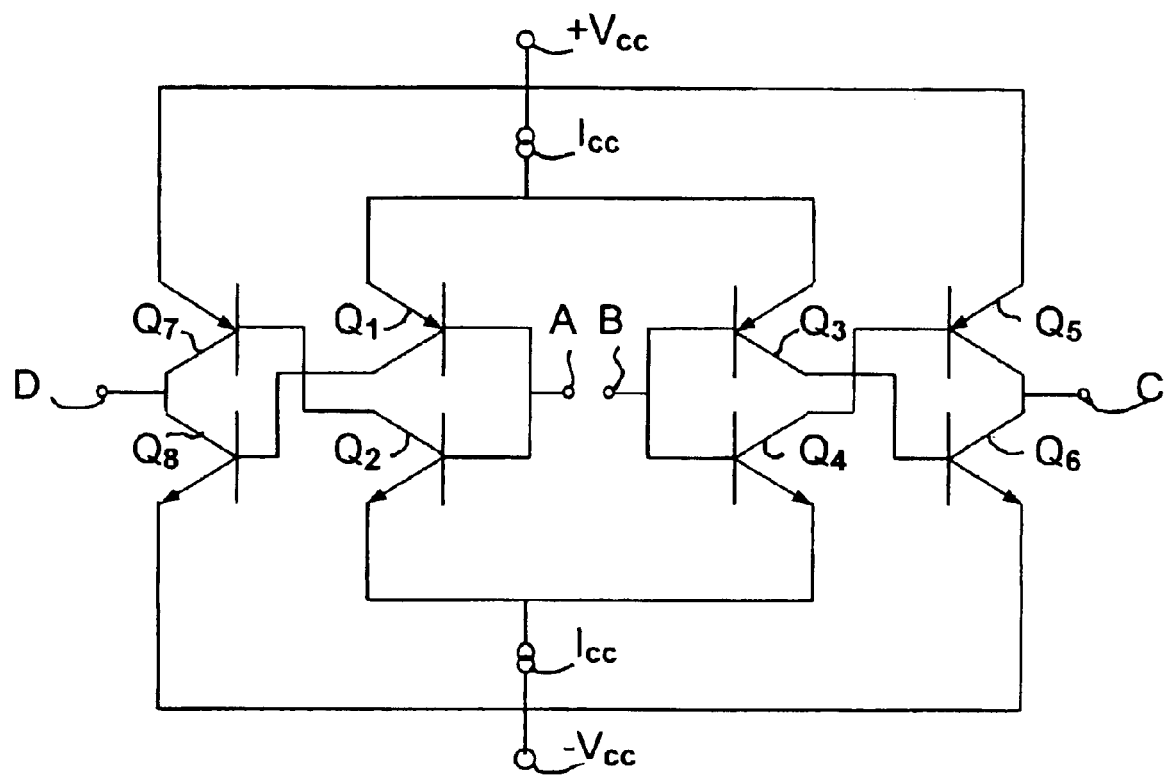
FIG. 8 shows an improvement on the basic circuit to handle some of the restrictions on usage. It relates to claims 1, 2, 4, 7 and 24.
Figure 15:
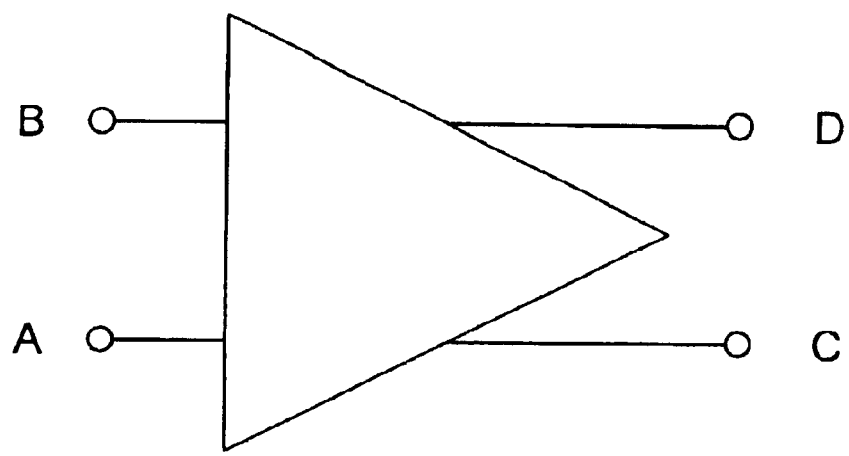
Figure 18:
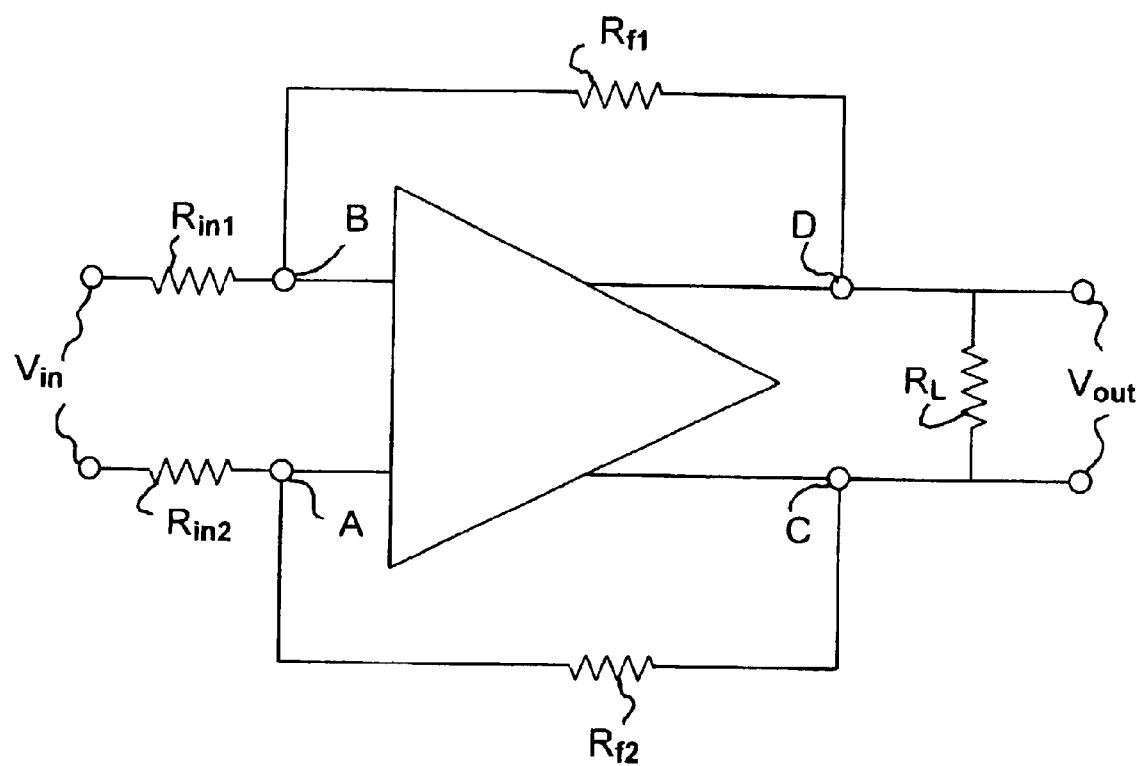
FIGS. 18, 19 and 20 are used to determine the closed loop gain of the amplifier.
Figure 19:
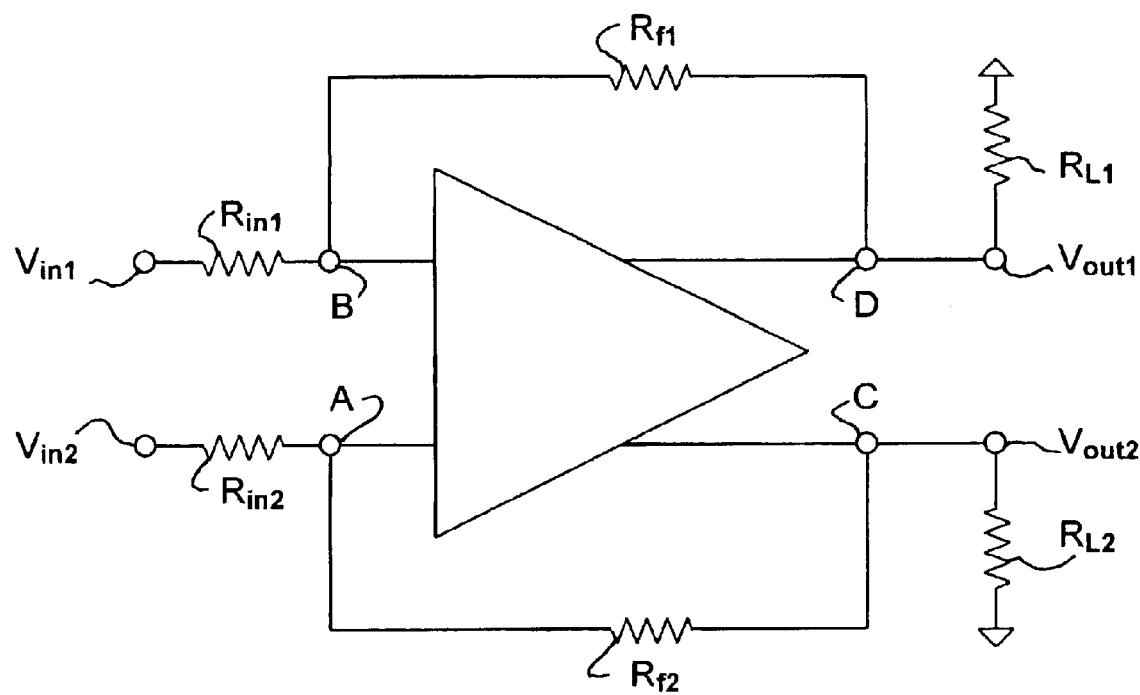
Figure 20:
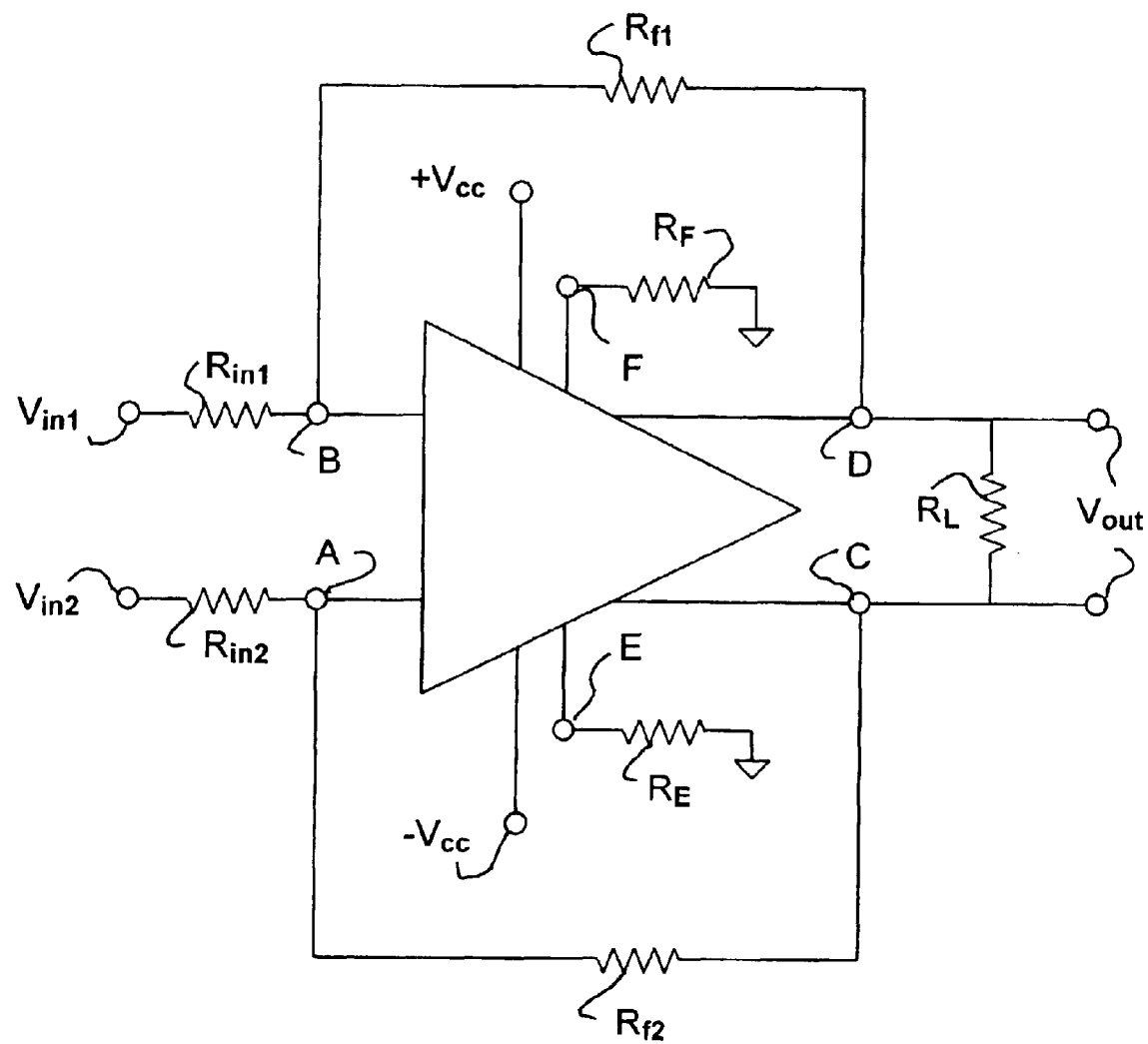

With FIG. 8, we leave behind common mode voltage problems. Here we add transistors $Q_7$ and $Q_8$ to unload any output voltage that may be created by the output currents from reflecting back to the inputs, thus unlocking the input terminals. Inputs A and B are Inverting and Non-Inverting Inputs as respect to Output C (and visa versa with respect to Output D). See FIG. 15, then $I_C=\beta^2(I_B-I_A)$ and $I_D=\beta^2(I_A-I_B)$. With A shorted to ground (generally through a resistor), then $I_D=-\beta^2*I_B$. Looking to FIG. 16, with an input resistor $R_{in}$, A connected to ground and output resistor $R_L$ (to ground), then $A_{ol}=V_{out}/V_{in}=-\beta^*R_L/R_{in}$. This is a similar equation to that associated with CFAs. Using feedback resistor of $R_f$ as shown in FIG. 17, and calculating the Loop Gain, we get Loop Gain=$(-\beta^{2*}R_L/R_{in})/(-R_f/R_{in})=\beta^{2*}R_L/R_f$. Again a similar equation to that of a CFA where the loop gain is a function of the feedback resistor but independent of the closed loop gain of the circuit. In usual terms of CFAs, the transresistance is simply $\beta^{2*}R_L$. The best references regarding transresistance of CFAs is Burr Brown Application Bulletin #193 *THE CURRENT-FEEDBACK OP AMP A HIGH SPEED BUILDING BLOCK* by Anthony D. Wang, and *Analog Circuit Design* (Edited by Jim Williams) Chapter 25 *Current-Feedback Amplifiers* by Sergio Franco. Note that the transresistance of the CLC401 is ≈710KΩ with a break frequency of 350 KHz which gives a product of 250×10$_9$. This is per data from Comlinear Corporation 1993–1994 Databook *Solutions with Speed* page 11-6 titled simply AN for Application Note. Normally this circuit from FIG. 8 will be operated as shown in FIGS. 18 and 19. A true high performance fully differential amplifier. Because the load is not referenced to ground, the common mode voltages at A, B, C, and D will float to the most influential reference. We don't expect to see much D.C. voltage on the resistors in FIG. 18 as current from the output (and possibly the input) will stabilize the circuit. Therefore if there is no reference connection between the input circuitry and the output circuitry, the amplifier will arrive at some compromise value. The current to determine that value will go though the resistors of FIG. 18. If there is a common reference between the input and output, that value will be used as the common mode point of the points A, B, C, and D. This can be seen more clearly in FIG. 19.

Figure 9:
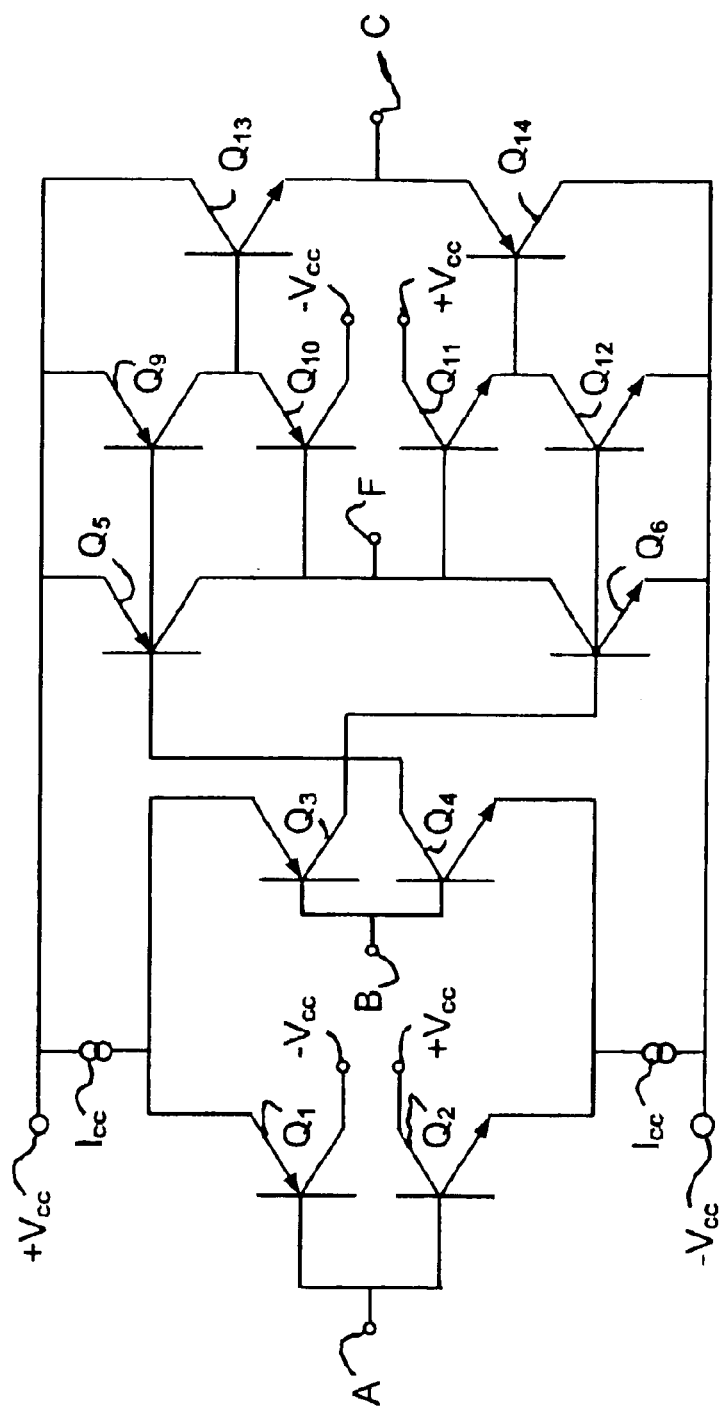
FIG. 9 shows an embodiment of the patent with the output of one side disabled and the other side buffered. It includes an internal summing point to allow control of the gain and frequency response of the amplifier. Note that there are still two current inputs but with the use of an impedance connected to point F, the output now should be considered a voltage. If the point F is not loaded with an impedance so as to create a voltage at the summing point, then the output should still be considered a current. This figure relates to claims 3, 5, 14, 15, 18, and 19.

FIG. 9 is a modification of 8 with one output buffered with a buffer similar to that used in prior art circuits i.e., LM6181. The buffer is created by transistors $Q_9$ through $Q_{14}$. A better buffer could be used here.

Figure 10:
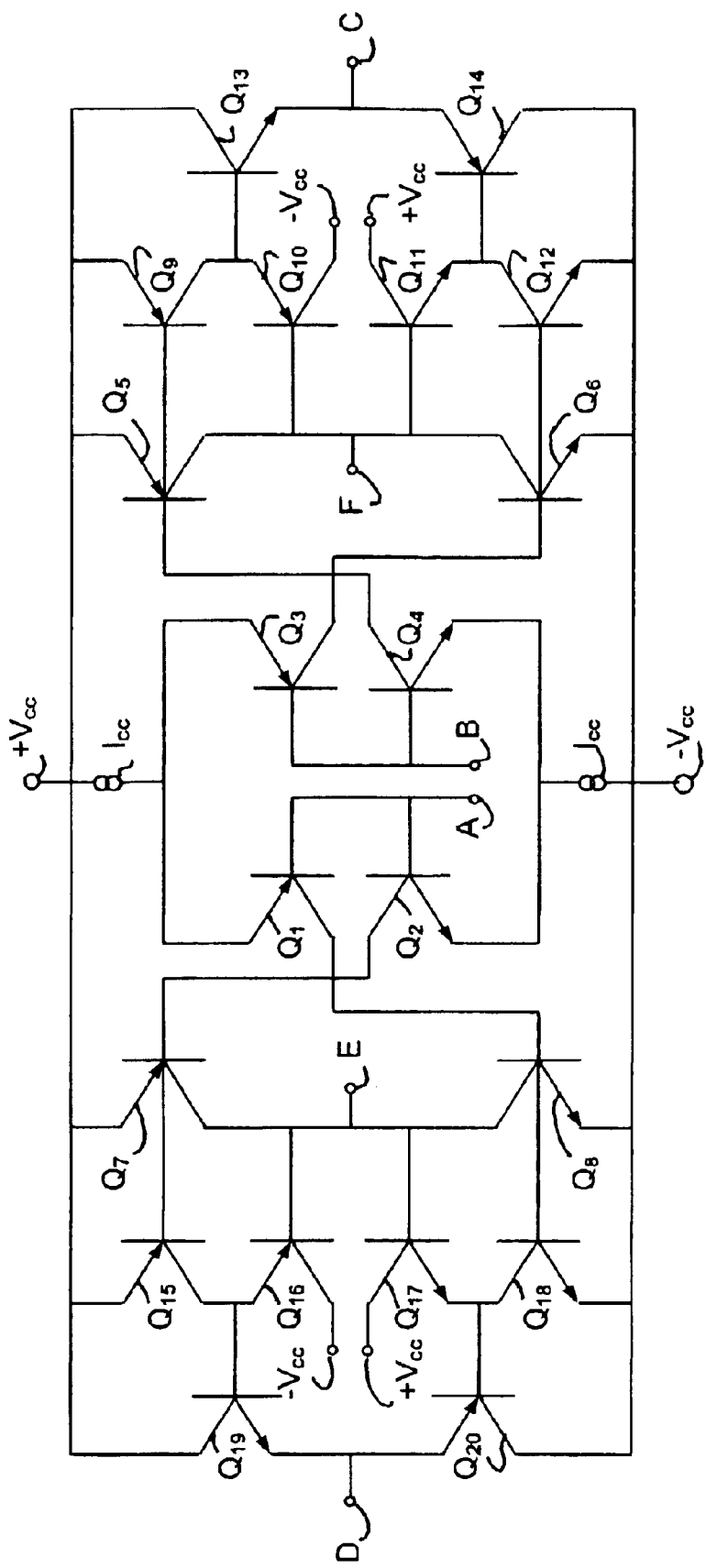
FIG. 10 shows an embodiment with both sides of the amplifier buffered. It has consequently two summing points, noted as E and F. This figure relates to claims 1, 2, 4, 8, and 10.

FIG. 10 with both outputs of the circuit buffered. The second buffer is created by transistors $Q_{15}$ through $Q_{20}$.

Of interest in FIG. 10 is the biasing and gain. Each of the input transistors draws ½ $I_{cc}$ current. This current is split by each of the next stage transistor's bases so that their collector currents is ¼ β $I_{cc}$ as are all the other transistors. This means 6 stages drawing ¼ β $I_{cc}$ for a total of 1.5 β $I_{cc}$. The amount drawn by the input transistors is over-shadowed and so the total ≈1.5 β $I_{cc}$ for the whole circuit assuming that is β fairly uniform among the transistors.

Points E and F (FIG. 10) are current summing/subtraction points as controlled by the input currents. These points can be loaded with a resistor, capacitor, combination or none. See FIG. 20. These establish the open loop gain of the circuit. Looking at each possibility separately.

a) Resistor. Assuming that $R_E$ (and $R_F$) each to ground are smaller (by at least an order of magnitude) than the impedance at that point as determined by the "input impedance" of the following buffer section, which in this case is $\beta^{2*}R_L$, then the open loop gain of the circuit is $-\beta^{2*}R_E/R_{in}$. Loop gain then becomes $\beta^{2*}R_E/R_f$. The open loop gain is now buffered from the load and independent of closed loop gain. Further, the loop gain now can be controlled by the choice of the feedback resistor $R_f$ or the summing point loading resistor $R_E$. This again is very similar to CFAs, with the transresistance of this circuit equal to $\beta^{2*}R_E$.

b) Capacitor. If we represent the impedance of the capacitor by $Z_E$ (which is equal to $(2\pi f C)^{-1}$) then open loop gain is $-\beta^{2*}Z_E/R_{in}$. The transresistance is $\beta^{2*}Z_E$. Loop gain then becomes $\beta^{2*}Z_E/R_f$. This gives one the ability to control the loop gain over frequency and thus tailor the stability and closed loop frequency response of the circuit. In particular, one can swamp the roll-off effects of $\beta^2$ or compensate for the roll-off because a roll-off of 12 db/octave which is inherent to $\beta^2$, could create instability.

c) C mbinati n. This is a more general case of b where $Z_E$ is just a more complicated value depending on the impedance of a capacitor in parallel with a resistor. This allows even more ability to control the loop gain of the circuit. Transresistance equal to $\beta^{2*}Z_E$ With the addition of the buffer, the transresistance is no longer tied to the load, i.e. $R_L$. This gives us a great degree of control over the characteristics of the amplifier. It also means that if $Z_E$ is much smaller than the input impedance of the buffer over frequency, the amplifier will be able to drive capacitive loads with no stability problems. This ability can be enhanced by the design of the "buffer".

d) None. In this case, the impedance of point E (or F) is that of the input impedance of the buffer which is approximately=$\beta^{2}*R_L$. The open loop gain now becomes=−$\beta^{4}*R_L/R_{in}$ with a transresistance of $\beta^{4}*R_L$. This is a very high figure and won't generally be realized because of imperfections of transistors, stray capacitance, leakage, etc. and should not be relied upon. A much more stable and predictable circuit can be created by controlling the impedance at these points E & F.

In any case, we can see from the above that the frequency at which the loop gain drops to unity can be extended/controlled considerably. These factors will not be discussed in full detail in this patent as they are not necessary to what is being patented. The exact equations can be worked out by someone skilled in the art. The circuit, though new, is very simple and once understood by a new practitioner can be used right away. This is part of the circuit's strength.

The embodiment circuits have the further advantage that they can be used with very small supply voltages. Circuits 4, 5, 6, 7, 8, and 11 can be used with supply voltages very small indeed. The supply voltages must be greater than ±($V_{be}$+$V_{sat}$) where $V_{be}$ is the largest base emitter voltage of any of the input transistors and $V_{sat}$ is the smallest voltage that can be sustained across the constant current sources that supply the current to the input transistors. Circuits 9, 10 and 12 must have more voltage as they must support an emitter follower output and so need enough voltage to be able to drive it. We see then that the supply voltages for circuits 4, 5, 6, 7, 8 and 11 could be as low as maybe ±0.6 volts (probably even less when engineered properly). This is a total of 1.2 volts total for the circuit. This is less than the 1.8 volts that are normally required by most low voltage circuits today. Of course with such low voltages, one must look closely to common mode considerations. Using inverting configurations referenced to ground, there are no common mode problems.

Further, with circuits 5, 7, 8 and 11, the input transistors can not enter into saturation under normal operation. This will greatly lower distortion in audio or other applications requiring accurate AC performance.

Figure 11:
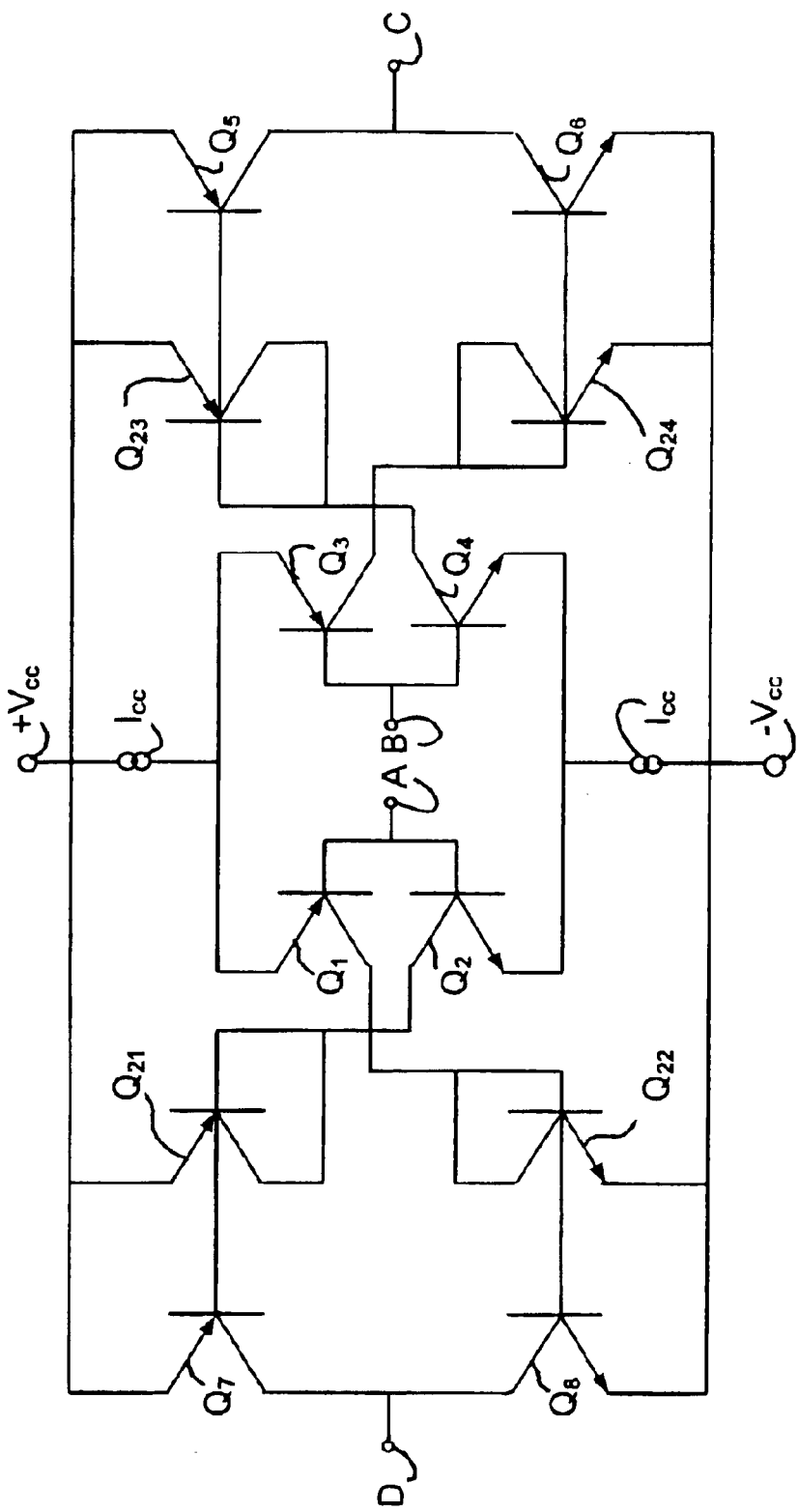
FIG. 11 shows a modification of FIG. 8 where the quiescent current of all the transistors, $Q_1$–$Q_8$, $Q_{21}$–$Q_{24}$, are substantially the same. This embodiment gives improved high frequency response. This figure relates to claims 1, 2, 4, and 20.

Still further, the input transistors in FIGS. 7, 8 and 11 are naturally cascoded. This, of course, improves high frequency performance and it is done without the extra voltage overhead normally needed.

An examination of AC distortion shows that an Inverting Configuration will always give the best results, i.e. low distortion, etc. This is because a NonInverting Configuration has common mode factors that alter the biasing/DC points of the circuit. This altering of internal voltages causes harmonic and non-harmonic distortion not to mention saturation, slew rate limiting, changes in device characteristics, etc. This current patent teaches circuits that are designed to best take advantage of this fact that inverting circuits are lower distortion. Even though the proposed circuits can effectively operate in a Non-Inverting Configuration, they perform best in an Inverting Configuration. When operated in Inverting Configuration, the Input Transistors operate in a near perfect state as regards dissipation, voltage, and current with no or little Miller Effect or Early Effect. Existing CFA designs are very difficult to use in an inverting configuration, because with a suitable feedback resistor, the input impedance becomes very small. For this reason, the CFA is almost always used as a Non-Inverting Amplifier. This is not optimum, as noted above, because during the process of amplifying, a non-inverting circuit continually alters its internal DC bias/set points. This introduces distortion. Further, with existing designs, when used either as a Non-Inverting or Inverting Amplifier, one can not control the frequency response because one can not use capacitance across the feedback resistor, whereas, with the proposed design, one can use a feedback capacitor to tailor the frequency response of the amplifier. This is possible because one has more direct control of the loop gain. I have built many amplifiers with capacitance shunting the feedback resistor. It is very easily done.

In all of the embodiments, when used in an Inverting Configuration, only under extreme conditions do any of the transistors ever turn off completely. This further enhances performance.

IF used with supplies of sufficient voltage, anti saturation circuits can be added for the "output transistors" in circuits 6–13. Better output "buffer" circuits can also be used in circuits 9, 10, and 12.

Figure 21:
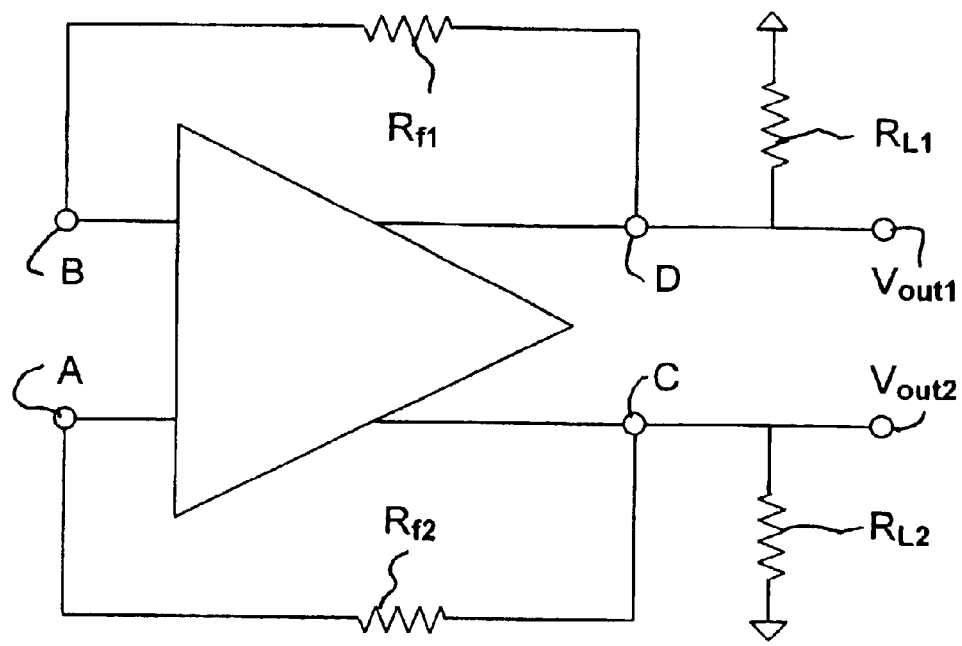
FIGS. 21, 22, 23, and 24 along with 18, 19 and 20 are used to examine the offset of the amplifier.
Figure 22:
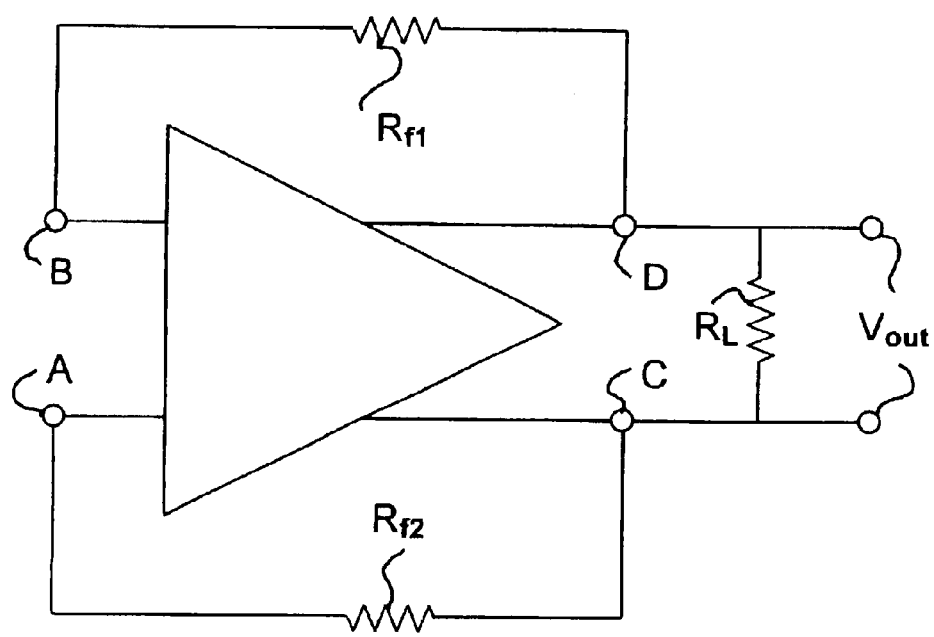

Another advantage of the proposed topologies is improvements in DC performance The proposed circuit has two balanced inputs. Any input offset is current offset. This current offset and the input bias current can be viewed together. In fact, they are the same. The only current needed by the inputs is offset current to force the output to zero, that is $I_5$=$I_6$. We can examine the offset produced in open loop and with only a feedback resistor. Looking at FIGS. 19–24 and applying these to the amplifier of FIG. 8 will give us these figures. In FIG. 21 or 22, we see that if we assume the current needed by the circuit is via B and that therefore there is no current through $R_{f2}$ and the voltage at C is zero, the current through $R_{f1}$ is $I_{input}$=$I_5*[(\beta_2\beta_6-\beta_1\beta_5)/\beta_1\beta_2\beta_5\beta_6]$. If the match of $\beta_2\beta_6$ to $\beta_1\beta_5$ is better than 200% (2 to 1) then $I_{input}$=$I_5/\beta_2\beta_6$. If $\beta_2\beta_6$=20,000, then $I_{input}$=2 ma/20,000=100 nA for a simple circuit and normal values of transistor beta. With a feedback resistor of 10KΩ, then the voltage offset at the output will be less than 1 mV. If the match is 10% (1.1 to 1.0) then $I_{input}$=$I_5/(10*\beta_2\beta_6)$. If $\beta_2\beta_6$=20,000, then with this close match, $I_{input}$=2 ma/200,000=10 nA. With a feedback resistor of 10KΩ), then the voltage offset at the output will be less than 100 μV. Reflected back to the input, the figures are lower yet. Note that the stated input current for the OPA603 by Burr Brown for the inverting input is 25 μA. This is approximately 1000 times more current needed that the device detailed above. This in part is the reason we can use reasonable values of feedback resistance without offset problems.

Figure 23:
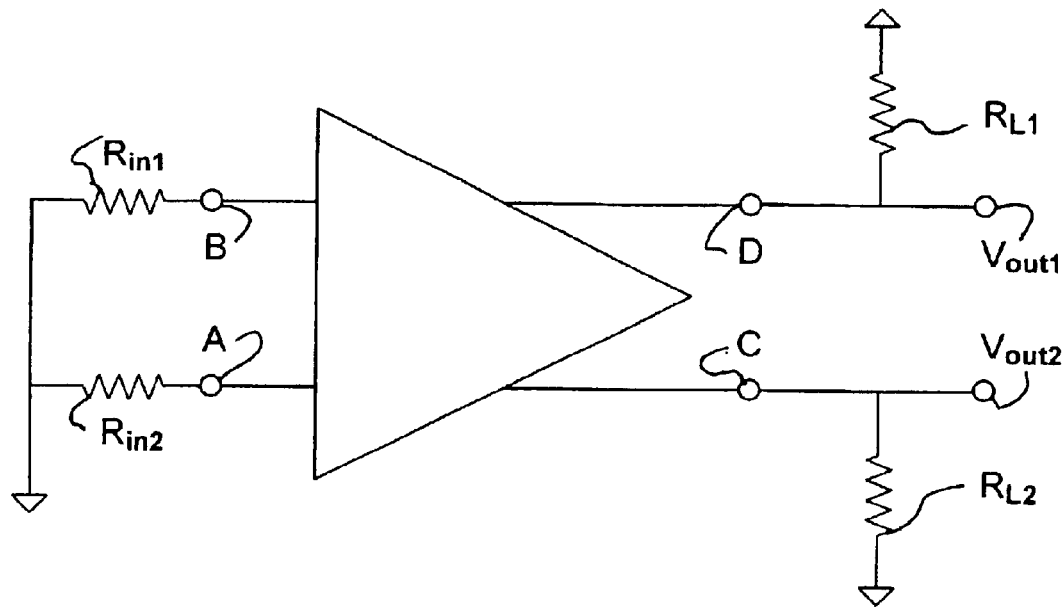
Figure 24:
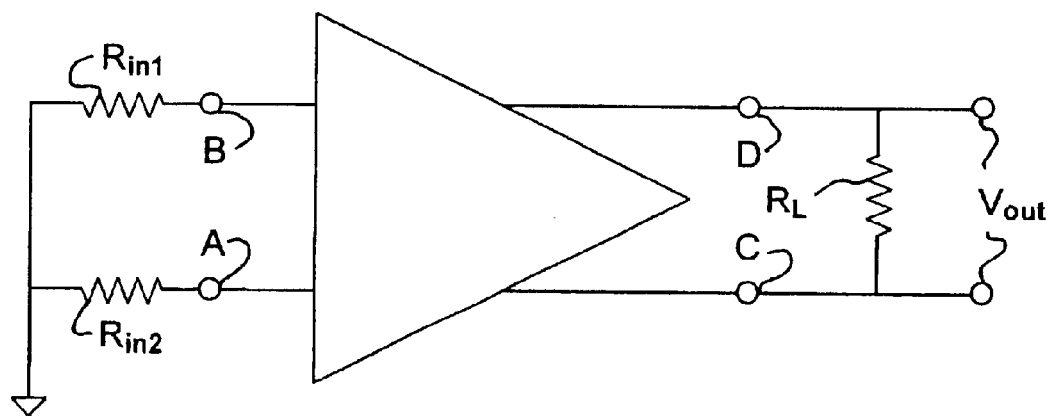

In FIGS. 23 and 24, we see that if we assume no current is input at B and A and that the voltage at D will be the current difference of the currents 16 and 15. Assuming fairly balanced current sources, we expect that the base currents of $Q_6$ and $Q_5$ are the same and equal to ½ $I_{cc}$. The output current then would be ½ $I_{cc}$ ($\beta_6-\beta_5$) which could be faily large of the order of magnitude of 10 to 100*$I_{cc}$. Obviously operating the circuit open loop isn't practical, the same as with any high gain amplifier.

Looking to FIG. 19, if we assume all of the input current is delivered via $R_{in1}$ into B and that none is supplied by $R_{f1}$ then per the above computing of input current of 10 nA though $R_{in1}$, we get for an input resistor of 1,000, the voltage offset at the output will be less than 10 μV. An input resistor of 100 Ohms would give an effective input offset at the input of only 1 μV.

Even taking in account the voltage drop of any current through a feedback resistor, we are lead to believe that the voltage offset at the output produced by any current needed to zero the output current, would be the input offset current dropped across the impedance at the input.

These are satisfactory figures and independent of closed loop voltage gain. Any drift with temperature will be caused by variation of the βs of the transistors. This variation is not nearly as drastic as the variation of current due to changes of $V_{be}$ experienced in prior art circuits. In fact, β will generally increase with temperature and so can be expected to decrease any input current needed to produce a zero output current. Also, the input stage, 4 transistors $Q_1$–$Q_4$, dissipates constant total power=$2*I_{cc}*V_{supply}$. In fact, each transistor can only vary in power dissipation from 0 to 2× in extreme. When positioned near to each other either in an Integrated Circuit or on a PCB, the DC Stability of the circuit can be very good. The quiescent current of the output stage(s) will increase as the β of the output transistors increase because of the constant drive current (equal to half the constant current from the constant current sources that supply the input stage). If the β of the input transistors increases, then the offset current will decrease. If DC performance is the most desired feature of a design, the input and output stages can be used at a lower quiescent current along with high β transistors and one can easily realize a very high performance DC amplifier.

Normally, low voltage supplies have forced many op amps to be designed with FETs of one kind or another. Low supply voltages have not been kind to DC (or AC) specs in op amps. If one is just dealing with low voltages and can stay within certain common mode ranges, the proposed circuits are quite fantastic for DC amplifying. The dissipation of the transistors (or the entire circuit) at low voltages is very small indeed. This further adds to a very stable DC performance. An example: assuming one can use the circuit of FIG. 4, with a supply voltage of ±0.7 volts and a quiescent current of 0.2 ma, we see that there is total dissipation of 140 μW and the ability to drive 2500Ωloads to ±0.5 volts. At these levels, there will be very little heating of the transistors and therefore very little variation of β, so almost nil variation of input current and therefore stable DC performance. With real attention to all the details for an application, it is possible to go much lower to ±0.5 volts and quiescent current of 1 μA for a total dissipation of 1 μW. Maybe even lower! Please note, the open loop input impedance is always basically= $β*R_L$, so the circuit doesn't load itself.

Applying the above to a specific example, let us look at the measuring of currents where there is a wide variation. Assume a current is sensed by a 0.1 mOhm resistor (shunt). The top range is say a 100 Amps for a voltage drop of 10 mV. The dissipation of the shunt is 1 Watt. The question is how low can we go in measuring current through the shunt before we are swamped by offset problems. We set up our amplifier in a differential configuration with a gain of 1000 and use an input resistors of 10 Ohms and feedback resistors of 10,000 Ohms. For 100 Amps dropping 10 mV across the shunt, the output of the amplifier would be 10 Volts. Using an amplifier design which includes a buffer, the input offset current would be less than 1 nA. This would create a voltage of 10 nV at the output of the amplifier. With a gain of 1000, this reflects back to an effective input offset voltage of 10 pV at the source. The amount of current across the shut to equal that amount of offset would be 100 nAmps. The range is from near 100 nAmps to 100 Amps, a dynamic range of 9 decades or $10_9$. The voltage output is probably still below the noise floor of many instruments.

Circuits 4, 8, and 11 are equally good when used with low supply voltages to produce great DC performance.

High supply voltages are not needed to get good DC or AC specs.

Normally, even with CFAs, one computes on the "input impedance". This is a measure of interest. The input impedance of the Inverting Input of a CFA is very low as basically it is an output of a voltage buffer. This makes it hard to use. The Non-Inverting Input of a CFA is said to be high. That is because it is basically a voltage input. Only the Inverting Input is a current input and thus functions as a "current feedback" point in a Current-Feedback Amplifier. BUT we can see that in a CFA, the Inverting Input draws lots of current really. On the order of 25 μA. Using large resistors for feedback resistors leads to problems with AC Stability and DC offset problems. When we look to the proposed topologies, we could say that the inputs are low impedance as the Δ Vin is almost zero thus implying that the impedance is near zero. While this might appear to be a problem, it is not. With a voltage amplifier, one attempts to generate as high an input impedance as possible so as not to affect the voltage input by drawing current. It is the case with this patent that we want to have as low an input impedance as possible so as not to affect the current input by generating a voltage difference at the input. This is also the case with the Inverting Input of a CFA. Many of the problems of the CFA revolve around the "non-zero impedance inverting input". A true zero input impedance would mean that even a small voltage input would produce infinity current into the input. This is not really needed or even desirable. As with a normal op amp, it is necessary that the loop resistors (components) are not "loaded" by the input current, i.e. that any current needed by the input do not "show up" on the feedback resistors. In other words, the input current should not affect the closed loop performance of the circuit. In the proposed circuit, it is desired that any voltage differences created by the amplifier's input impedances do not affect the closed loop performance of the circuit. We can see that in most of the embodiments, if one of the inputs is set at a certain voltage, the other input is to some degree locked to that voltage. Any input current will not change the voltage at the input of the circuit. In particular, if a current is fed into the circuit via an input resistor, then the whole driving voltage will be dropped across the input resistor. This is ideal. We see then that when dealing with voltages, that the closed loop input impedance of an configured embodiment/usage of the proposed circuit would just be that of the input resistor. This is nice as that is just what it is with a voltage-feedback amplifier. We see that a voltage imposed at the input end of the input resistance will cause to flow a current equal to $V_{in}/R_{in}$. In an open loop configuration using FIG. 8, this will cause a voltage to drop across an output load (resistance) equal to=$-β^{2}*R_L·V_{in}/R_{in}$. Dividing each side by $V_{in}$ gives us the open loop voltage gain as stated above $A_{oi}$=$-β^{2}* R_L/R_{in}$. Using "current feedback" (sending back current into the summing point), to produce zero current at the summing point, means that $V_{out}/R_f$=$-V_{in}/R_{in}$. This becomes the same as with a voltage-feedback op amp, i.e. $V_{out}/V_{in}$=$-R_f/R_{in}$. The loop gain then becomes: Loop Gain=$(-β^{2}*R_L/R_{in})/(-R_f/R_{in})$=$β^{2}*R_L/R_f$.

An important difference then between the proposed amplifier topologies and that of a traditional CFA is that the proposed amplifier topologies have two balanced current inputs that draw small amounts of current to produce a desired results, whereas the traditional CFA has two unbalanced inputs only one of which is actually a current input but which demands a significant current. This decrease of current required is of the order of magnitude of from β to $β^3$, depending on the embodiment and whether it uses an output buffer or not. This decrease of input current is significant and makes the proposed circuit much easier to use and more able to get the performance desired than previous op amps including CFAs. We showed above that we can expect an input current of about 10 nA as compared to 25 μA for prior art CFAs.

Figure 12:
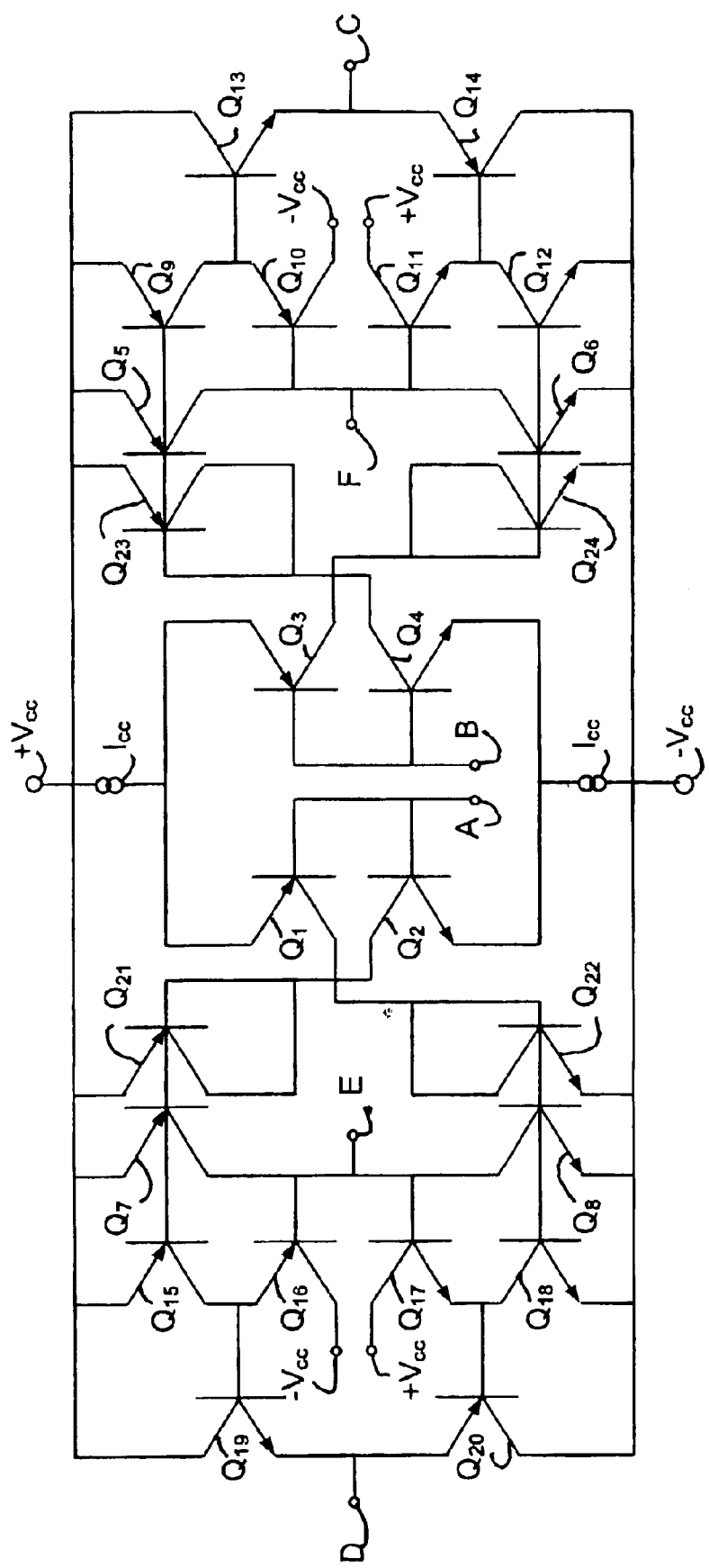
FIG. 12 shows a modification to the circuit in FIG. 10 where the all the transistors have substantially the same quiescent current. Even with this number of transistors the biasing is simple, uniform and stable. This figure relates to claims 1, 2, 4 and 8.

All the embodiments detailed here have good high frequency properties. One can further optimize the circuit for high frequency use by reducing the open loop gain and increasing the currents used internally. Examples of such are circuits in FIGS. 11 and 12. FIG. 11 is created from FIG. 8 with the addition of transistors $Q_{21}$, $Q_{22}$, $Q_{23}$, and $Q_{24}$ connected as diodes with bases connected to collectors. FIG. 12 is created from FIG. 10 with the addition of the same transistors as connected as diodes.

In these circuits the quiescent current of each of the transistors in the circuit is ½ $I_{cc}$. Therefore the frequency response of all areas of the circuit is much better than where the input stage is at a reduced level of current, even though the input stage is cascoded. The gain is reduced (by a factor of β). The transresistance of circuit 11 is $β*Z_L$ and circuit 12 is $β*Z_E$. These circuits give a clean roll-off and the ability to tailor the response for maximum bandwidth. With a better output stage than shown in FIG. 12, the results would be better yet. Expected results (with a $Z_L$ of 1KΩ) for circuit 11 is a transresistance of 100KΩ with a break frequency of greater than 2500 KHz for a product of $250×10_9$. This is the same product as for the CLC401 as stated above but with a much simpler circuit, more options, easier to use and better specs in other areas. When we look to circuit 12, we see an improvement of an order of magnitude at least. The transresistance of circuit 12 with an internal resistance of 10K ($R_E$) is 1000KΩ with again a break frequency of greater than 2500 KHz for a product of $2500×10^9$. This tells us that we can get a closed bandwidth of 500 MHz with a $R_f$ of 5000. The circuit can be used either as an inverting or non-inverting gain amplifier. The closed loop frequency response is, as it is with CFAs in general, fairly independent of gain. Using an input resistor $R_{in}$ of 500, we get a gain of 10 with the bandwidth of 500 MHz. Increasing $R_E$ or replacing it with a capacitor or using high frequency transistors would increase these figures.

Figure 13:
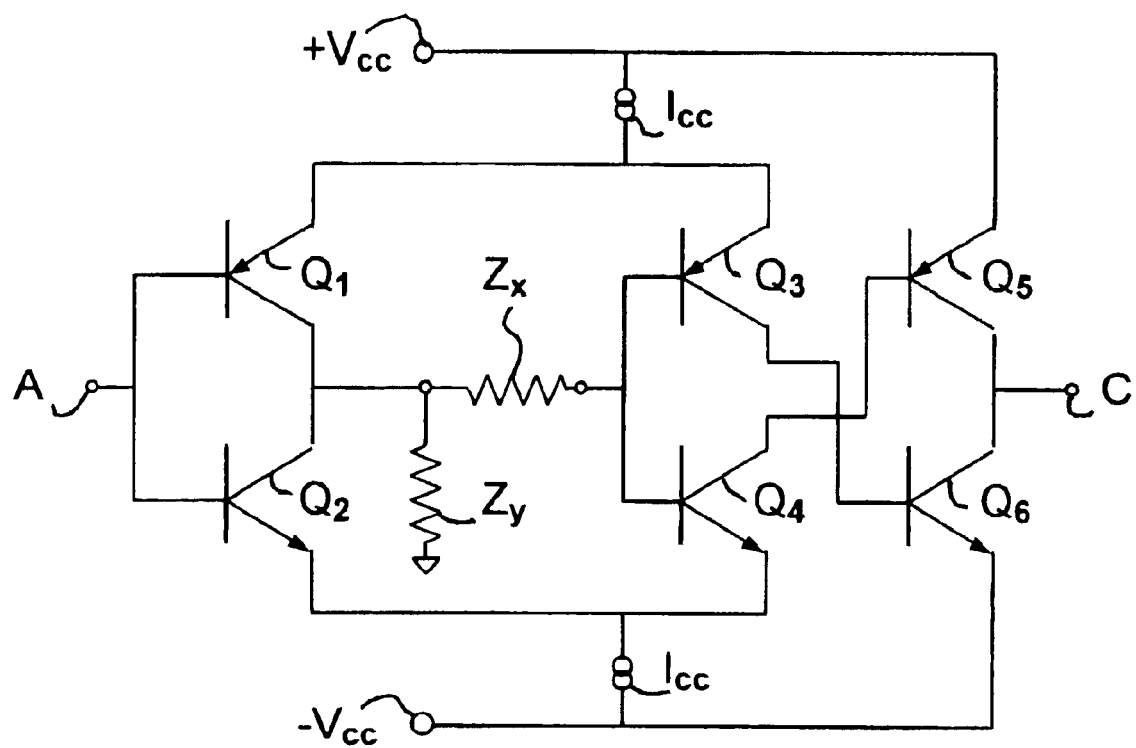
FIG. 13 shows the circuit of FIG. 6 with additional components that allows the ganging of the two halves of the circuit to produce an amplifier that has only one current input and one current output. Output C is out of phase with the input A and so negative feedback can be applied to the circuit. This figure relates to claims 11 and 13.
Figure 14:
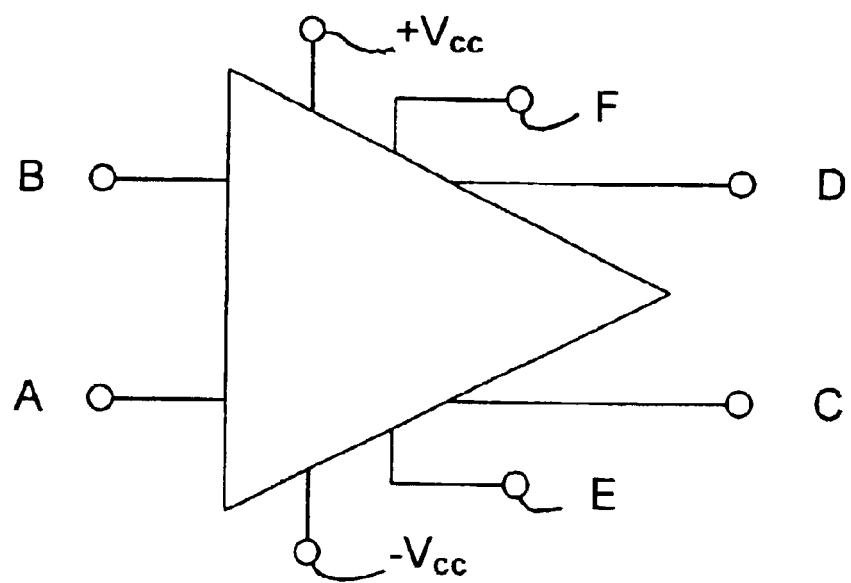
FIGS. 14 and 15 show block diagrams of the amplifier circuit.

In FIG. 13, we see one further set of ways to use the circuit. Using one output to drive a non-inverting input of the other output, we get a still further increase of transresistance. We see the transresistance is=$β^{2}*R_L[(Z_x+(β+1)Z_y)/(Z_x+Z_y)]$. By making $Z_x$ "small", we get an improvement of (β+1) in transresistance. The simplest case is just to delete $Z_y$ and connect B to C in FIG. 6. An added benefit would be that we would now have "lost" the non-inverting input altogether, which can be very useful indeed. We could also make $Z_x$ and $Z_y$ frequency dependent and thus tailor/enhance either the AC or DC performance of the amplifier. The common mode voltage for the circuit will be the reference voltage used by the output load and input.

A special note here is in order. With a voltage amplifier, one must be alert to shorts on the outputs. One can leave an output open or lightly loaded with a large resistor or a small capacitor. Anything more can disrupt the circuit.

With a current amplifier, the concern is opposite. One needs to be concerned with any open loads. An open load would cause the output to swing widely in both directions and possibly saturate at the supply rails. An unused output would best be loaded by a resistor or capacitor. This prevents it from saturating unpredictably. This is, of course, not the case with those circuit that use a voltage buffer on the output. These circuits are generally internally loaded and so can tolerate an open output. In fact, such buffers are not happy with a highly loaded or shorted output. Using the proposed topologies, the amplifiers which have an output voltage buffer still have the benefit of having current inputs.

All of the embodiments as detailed above and in the referenced Figures demonstrate examples of means as included in the claims, in particular claims 1, 2 and 3. All the embodiments except FIG. 13 show two inputs that are responsive to currents. FIG. 13 actually shows how to use the two inputs of FIG. 6 to get a new special circuit as detailed in claims 11 and 13. All the circuits have low enough offsets that feedback can be applied successfully. In fact some have very low offsets as detailed above. All the circuits show inputs that are substantially equal. Hard to see how one could make them more alike. Most of the embodiments show amplifiers which are totally symmetrical. All the amplifiers have at least one input that is an inverting input for one of the outputs. So all means elements of claims 1, 2 and 3 are shown multiple times in the embodiments detailed in this application.

From the forgoing, it should be clear that the present invention may be embodied in forms other than those described above. The above-described examples are therefore to be considered in all respects illustrative and not restrictive or limiting, the scope of the invention being indicated by the appended claims rather than the foregoing. All changes that come within the meaning and scope of the claims are intended to be embraced therein.

What is claimed is:

1. A fully symmetrical current amplifier comprising:
   two inputs and a plurality of outputs,
   first means for amplifying such that a first input is responsive to a current signal;
   second means for amplifying such that a second input is responsive to a current signal;
   third means for biasing such that voltage and current offset can be reduced to approximately zero;
   wherein said first input and said second input possess substantially equal properties;
   wherein there is at least one input, inverting input, for which at least one output produces a signal in response to a signal at said inverting input that is 180° out of phase with said input signal at said inverting input;
   whereby the amplifier can use negative feedback;
   whereby the amplifier can use techniques normally associated with Current Feedback Amplifiers; and
   whereby improved performance can be realized while using less complex circuitry.

2. A fully symmetrical current amplifier comprising:
   two inputs and two outputs, where outputs are designated first and second output;
   fourth means for amplifying such that a first input is responsive to a current signal;
   fifth means for amplifying such that a second input is responsive to a current signal;
   sixth means for biasing such that voltage and current offset can be reduced to approximately zero;
   wherein said first input and said second input possess substantially equal properties;
   wherein there is at least one input, inverting input, for which at least one output produces a signal in response to a signal at said inverting input that is 180° out of phase with said input signal at said inverting input;
   whereby the amplifier can use negative feedback;
   whereby the amplifier can use techniques normally associated with Current Feedback Amplifiers; and
   whereby improved performance can be realized while using less complex circuitry.

3. A fully symmetrical current amplifier comprising:
   two inputs and one output, where outputs are designated first and second output;

seventh means for amplifying such that a first input is responsive to a current signal;

eighth means for amplifying such that a second input is responsive to a current signal;

ninth means for biasing such that voltage and current offset can be reduced to approximately zero;

wherein said first input and said second input possess substantially equal properties;

wherein there is at least one input, inverting input, for which the output produces a signal in response to a signal at said inverting input that is 180° out of phase with said input signal at said inverting input;

whereby the amplifier can use negative feedback;

whereby the amplifier can use techniques normally associated with Current Feedback Amplifiers; and whereby improved performance can be realized while using less complex circuitry.

4. The amplifier as set forth in claim 2 wherein:

increasing current into said first input produces decreasing current in said first output and increasing current into said second input produces decreasing current in said second output and decreasing current into said first input produces increasing current in said first output and decreasing current into said second input produces increasing current in said second output;

increasing current into said first input produces increasing current in said second output and increasing current into said second input produces increasing current in said first output and decreasing current into said first input produces decreasing current in said second output and decreasing current into said second input produces decreasing current in said first output; and whereby said association of said first input to said first output and said second input to said second output will be called an inverting relationship and the relationship of said first input to said second output and said second input to said first output will be called a non-inverting relationship;

whereby said amplifier produces a current between the said first and second outputs proportional to the current difference between said first and second inputs, such output current difference can travel via ground and power supplies.

5. The amplifier as set forth in claim 3:

wherein increasing current into first input produces decreasing current in said output and increasing current into second input produces increasing current in said output and similarly decreasing current into said first input produces increasing current in said output and decreasing current into said second input produces decreasing current in said output;

whereby said association of said first input to said output will be called an inverting relationship and the relationships of said second input to said output will be called a non-inverting relationship;

whereby said amplifier produces a current output proportional to the current difference between said second and first inputs.

6. The amplifier as set forth in claim 4 comprising:

two NPN transistors, two PNP transistors and two current sources;

wherein the bases of first NPN transistor and first PNP transistor are connected and, the collector of first NPN transistor is connected to the collector of said second PNP transistor and, the bases of second NPN transistor and second PNP transistor are connected and, the collector of said second NPN transistor is connected to the collector of said second PNP transistor and, the emitters of said first PNP transistor and said second PNP transistor are connected together to one terminal of a first constant current source which is connected to a positive voltage supply and, the emitters of said first NPN transistor and said second NPN transistor are connected together to one terminal of a second constant current sink which is connected to a negative voltage supply and;

whereby the connection of said bases of said first NPN transistor and first PNP transistor can be referred to as said first input and the connection of said bases of said second NPN transistor and second PNP transistor can be referred to as said second input, and the connection of the said collectors of said first NPN transistor and said first PNP transistor can be referred to as said first output and the connection of said collectors of said second NPN transistor and said second PNP transistor can be referred to as said second output, and whereby the amplifier is a fully differential amplifier of a simple design.

7. The amplifier as set forth in claim 4 comprising:

four NPN transistors, four PNP transistors and two current sources;

wherein the bases of first NPN transistor and first PNP transistor are connected and, said first NPN transistor collector is connected to the base of third PNP transistor where emitter of said third PNP transistor is connected to a positive voltage supply and, said first PNP transistor collector is connected to the base of third NPN transistor where emitter of said third NPN transistor is connected to a negative voltage supply and, the bases of second NPN transistor and second PNP transistor are connected and, said second NPN transistor collector is connected to the base of fourth PNP transistor where emitter of said fourth PNP transistor is connected to a positive voltage supply and, said second PNP transistor collector is connected to the base of fourth NPN transistor where emitter of said fourth NPN transistor is connected to a negative voltage supply and, the emitters of said first PNP transistor and said second PNP transistor are connected together to one terminal of a first constant current source which is connected to a positive voltage supply and, the emitters of said first NPN transistor and said second NPN transistor are connected together to one terminal of a second constant current sink which is connected to a negative voltage supply and, collectors of said third NPN transistor and said third PNP transistor are connected together and, collectors of said fourth NPN transistor and said fourth PNP transistor are connected together;

whereby the connection of said bases of said first NPN transistor and first PNP transistor can be referred to as said first input and the connection of said bases of said second NPN transistor and second PNP transistor can be referred to as said second input, and the connection of the said collectors of said third NPN transistor and said third PNP transistor can be referred to as said second output and the connection of said collectors of said fourth NPN transistor and said fourth PNP transistor can be referred to as said first output, and whereby the amplifier is a fully differential amplifier of a simple design with high performance that can be operated from low voltage supplies of less than 0.75 volts plus and minus.

8. The amplifier as set forth in claim 2 further including tenth means for isolating said first output and said second output from external loads;

said tenth means would include the use of buffer amplifiers between the said first and said second outputs and any loads being driven by said first and said second outputs;

whereby a practitioner of the art could more closely control the response of the amplifier.

9. The amplifier as set forth in claim 8 further including eleventh means for converting internally each of said first output and said second output from a current to a voltage, to allow for compensation of loop gain and frequency response of the amplifier while isolating said first output and said second output from external loads;

said eleventh means would include the use of an impedance to ground at each of said first output and said second output and the inclusion of buffer amplifiers between the said first and second outputs and any loads being driven by said outputs;

whereby the outputs at said loads, buffered outputs, would be in the form of a voltage rather than a current;

whereby a practitioner of the art could more closely control the response of the amplifier by choosing the impedance at said first and said second outputs.

10. The amplifier as set forth in claim 8 comprising:

two current sources, 10 NPN transistors and 10 PNP transistors;

wherein said transistors, said current sources and supply voltages are connected as detailed in FIG. 10;

wherein said first and said second outputs are marked as E and F and are internal summing/compensation points of the amplifier and any impedances connected to said points E and F create a voltage at said points E and F and said impedances alter the gain of the amplifier;

wherein output at said loads is a voltage rather than a current.

11. The amplifier as set forth in claim 2 wherein:

increasing current into said first input produces decreasing current in both said first output and said second output and increasing current into said second input produces increasing current in both said first output and said second output and, decreasing current into said first input produces increasing current in both said first output and said second output and decreasing current into said second input produces decreasing current in both said first output and said second output;

whereby association of said first input to said first output will be called an inverting relationship and association of said second input to said second output will be called an non-inverting relationship.

12. The amplifier as set forth in claim 11 comprising:

three NPN transistors, three PNP transistors and two current sources;

wherein the bases of first NPN transistor and first PNP transistor are connected and, said first NPN transistor collector is connected to the base of third PNP transistor where emitter of said third PNP transistor is connected to a positive voltage supply and, said first PNP transistor collector is connected to the base of third NPN transistor where emitter of said third NPN transistor is connected to a negative voltage supply and, the bases of second NPN transistor and second PNP transistor are connected and, the emitters of said first PNP transistor and said second PNP transistor are connected together to one terminal of a first constant current source which is connected to a positive voltage supply and, the emitters of said first NPN transistor and said second NPN transistor are connected together to one terminal of a second constant current sink which is connected to a negative voltage supply and, collectors of said first NPN transistor and said first PNP transistor are connected together and, collectors of said third NPN transistor and said third PNP transistor are connected together and;

the connection of said bases of said first NPN transistor and said first PNP transistor can be referred to as said second input and the connection of said bases of said second NPN transistor and second PNP transistor can be referred to as said first input and, the connection of the said collectors of said third NPN transistor and said third PNP transistor can be referred to as said second output and the connection of said collectors of said second NPN transistor and said second PNP transistor can be referred to as said first output.

13. The amplifier as set forth in claim 11 further including:

twelfth third means for compounding the gains of the two sections of the amplifier and eliminate one input and one output;

said twelfth means would include connecting said first output to said second input;

said twelfth means would include an impedance network, a plurality of impedances connected in series and parallel to ground, connected between the said first output and said second input;

whereby a practitioner of the art could more closely control of the open loop frequency response of the amplifier;

whereby such a amplifier would have an inverting input and an output, would be referenced only by current until the load is connected in some forcing manner to a voltage reference such as ground;

whereby one can direct negative feedback from the resulting output, said second output, to the resulting inverting input, said first input, to establish a fixed closed loop gain for the amplifier;

whereby the amplifier is no longer affected by a high-gain non-inverting input, which in prior amplifier designs could introduce hum and interference.

14. The amplifier as set forth in claim 2 further including:

thirteenth means for deactivating one of the two said outputs of the said amplifier;

said thirteenth means would include connecting one of said outputs to a low-impedance point, such low impedance point includes, but not limited to, ground and power supply terminals;

whereby the amplifier is easier to use when driving a load to ground.

15. The amplifier as set forth in claim 5 further including:

fourteenth means for isolating said output from an external load;

said fourteenth means would include the use of a buffer stage between said output and an external load;

said fourteenth means could also include the use of an impedance to ground at the said output to produce a voltage at said point;

whereby the output at said load could be in the form of a voltage rather than a current;

whereby said inputs would still be controlled by current rather than voltage thus preserving the benefits of the amplifier topologies;

whereby by the use of series impedances, external voltages could be seen as a currents by said inputs.

16. The amplifier as set forth in claim 5 comprising:

two NPN transistors, two PNP transistors and two current sources;

wherein the bases of first NPN transistor and first PNP transistor are connected; and the collector of said first NPN transistor is connected to a negative supply voltage; and the collector of said second PNP transistor is connected to a positive supply voltage and, the bases of second NPN transistor and second PNP transistor are connected and, the collector of said second NPN transistor is connected of the collector of said second PNP transistor and, the emitters of said first PNP transistor and said second PNP transistor are connected together to one terminal of a first constant current source which is connected to a positive voltage supply and, the emitters of said first NPN transistor and said second NPN transistor are connected together to one terminal of a second constant current sink which is connected to a negative voltage supply and;

whereby the connection of said bases of said first NPN transistor and first PNP transistor can be referred to as said first input and the connection of said bases of said second NPN transistor and second PNP transistor can be referred to as said second input and, the connection of the said collectors of said second NPN transistor and said second PNP transistor can be referred to as said output.

17. The amplifier as set forth in claim 5 comprising:

three NPN transistors, three PNP transistors and two current sources;

wherein the bases of first NPN transistor and first PNP transistor are connected and, said first NPN transistor collector is connected to the base of third PNP transistor where emitter of said third PNP transistor is connected to a positive voltage supply and, said first PNP transistor collector is connected to the base of third NPN transistor where emitter of said third NPN transistor is connected to a negative voltage supply and, the bases of second NPN transistor and second PNP transistor are connected and, said second NPN transistor collector is connected to the positive voltage supply and, said second PNP transistor collector is connected to the negative voltage supply, the emitters of said first PNP transistor and said second PNP transistor are connected together to one terminal of a first constant current source which is connected to a positive voltage supply and, the emitters of said first NPN transistor and said second NPN transistor are connected together to one terminal of a second constant current sink which is connected to a negative voltage supply and, collectors of said third NPN transistor and said third PNP transistor are connected together;

whereby the connection of said bases of said first NPN transistor and first PNP transistor can be referred to as said first input and the connection of said bases of said second NPN transistor and second PNP transistor can be referred to as said second input and, the connection of the said collectors of said third NPN transistor and said third PNP transistor can be referred to as said output.

18. The amplifier as set forth in claim 13 further including:

fifteenth means for converting internally said output from a current to a voltage, to allow for compensation of loop gain and frequency response of the amplifier while isolating said output from an external load;

said fifteenth means would include the use of an impedance to ground at said output and a buffer amplifier between the said output and a load being driven;

whereby the output signal at the said load would be in the form of a voltage rather than a current;

whereby a practitioner of the art could more closely control the response of the said amplifier.

19. The amplifier as set forth in claim 18 comprising:

two current sources, 6 NPN transistors and 6 PNP transistors;

wherein said transistors, said current sources and supply voltages are connected as detailed in FIG. 9;

wherein said sixth means would include the connection of an impedance from point marked F to ground;

wherein output signal at said load is a voltage rather than a current.

20. The amplifier as set forth in claim 4 further including sixteenth means for establishing the quiescent current of all the transistors to be substantially the same;

wherein sixteenth seventh means would include the use of current mirrors;

whereby the closed loop frequency response of the circuit is increased at the expense of loop gain;

whereby the circuit would have ease of loop gain compensation.

21. The amplifier as set forth in claim 20 comprising:

six NPN transistors, six PNP transistors and two current sources;

wherein the bases of first NPN transistor and first PNP transistor are connected and, said first NPN transistor collector is connected to the bases of third and fifth PNP transistors where emitters of said third and fifth PNP transistors are connected to a positive voltage supply and, said first PNP transistor collector is connected to the base of third and fifth NPN transistors where emitters of said third and fifth NPN transistors are connected to a negative voltage supply and, the bases of second NPN transistor and second PNP transistor are connected and, said second NPN transistor collector is connected to the base of fourth and sixth PNP transistors where emitters of said fourth and sixth PNP transistors are connected to a positive voltage supply and, said second PNP transistor collector is connected to the base of fourth and sixth NPN transistors where emitters of said fourth and sixth NPN transistors are connected to a negative voltage supply and, the emitters of said first PNP transistor and said second PNP transistor are connected together to one terminal of a first constant current source which is connected to a positive voltage supply and, the emitters of said first NPN transistor and said second NPN transistor are connected together to one terminal of a second constant current sink which is connected to a negative voltage supply and, collectors of said fifth and sixth NPN transistors are connected to the bases of self said transistor and, collectors of said fifth and sixth PNP transistors are connected to the bases of self said transistors and, collectors of said third NPN transistor and said third PNP transistor are connected together and, collectors of said fourth NPN transistor and said fourth PNP transistor are connected together, whereby the connection of said bases of said first NPN transistor and first PNP transistor can be referred to as said first input and the connection of said bases of said second NPN transistor and second PNP transistor can be referred to as said second input and, the connection of the said collectors of said third NPN transistor and said third PNP transistor can be referred to as said second output and the connection of said collectors of said fourth NPN transistor and said fourth PNP transistor can be referred to as said first output.

22. The amplifier as set forth in claim 1 further including seventeenth means for converting an external signal voltage input to an input current to said amplifier and eighteenth means for converting said amplifier output current to a voltage;

wherein said seventeenth means would include a series input impedance to a plurality of said inputs; and wherein eighteenth means would include a parallel output impedance to ground;

whereby amplifier could then be responsive to voltages while still operating in the current domain.

23. The amplifier of claim 2 further including nineteenth means for supplying negative current feedback to the amplifier;

wherein said nineteenth means would include a feedback impedance from said first output to said first current input and from said second output to said second current input;

thereby with the use of an input resistor one realizes a predictable fixed voltage closed loop gain.

24. The amplifier as set forth in claim 1 wherein said means comprising:

four NPN transistors, four PNP transistors and two current sources;

wherein the bases of first NPN transistor and first PNP transistor are connected and, said first NPN transistor collector is connected to the base of third PNP transistor where emitter of said third PNP transistor is connected to a positive voltage supply and, said first PNP transistor collector is connected to the base of third NPN transistor where emitter of said third NPN transistor is connected to a negative voltage supply and, the bases of second NPN transistor and second PNP transistor are connected and, said second NPN transistor collector is connected to the base of fourth PNP transistor where emitter of said fourth PNP transistor is connected to a positive voltage supply and, said second PNP transistor collector is connected to the base of fourth NPN transistor where emitter of said fourth NPN transistor is connected to a negative voltage supply and, the emitters of said first PNP transistor and said second PNP transistor are connected together to one terminal of a first constant current source which is connected to a positive voltage supply and, the emitters of said first NPN transistor and said second NPN transistor are connected together to one terminal of a second constant current sink which is connected to a negative voltage supply and, collectors of said third NPN transistor and said third PNP transistor are connected together and, collectors of said fourth NPN transistor and said fourth PNP transistor are connected together;

whereby the connection of said bases of said first NPN transistor and first PNP transistor can be referred to as said first input and the connection of said bases of said second NPN transistor and second PNP transistor can be referred to as said second input, and the connection of the said collectors of said third NPN transistor and said third PNP transistor can be referred to as a second output and the connection of said collectors of said fourth NPN transistor and said fourth PNP transistor can be referred to as a first output, and whereby the amplifier is a fully differential current amplifier of a symmetrical and simple design with high performance that can be operated from low voltage supplies of less than 0.75 volts plus and minus.

\* \* \* \* \*